(12) United States Patent
Hidaka

(10) Patent No.: US 6,680,862 B2
(45) Date of Patent: Jan. 20, 2004

(54) MEMORY DEVICE HAVING WIDE MARGIN OF DATA READING OPERATION, FOR STORING DATA BY CHANGE IN ELECTRIC RESISTANCE VALUE

(75) Inventor: Hideto Hidaka, Hyogo (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 10/446,872

(22) Filed: May 29, 2003

(65) Prior Publication Data

US 2003/0202407 A1 Oct. 30, 2003

Related U.S. Application Data

(62) Division of application No. 09/944,346, filed on Sep. 4, 2001, now Pat. No. 6,587,371.

(30) Foreign Application Priority Data

Mar. 5, 2001 (JP) .......................................... 2001-060299

(51) Int. Cl.$^7$ ........................... G11C 11/00; G11C 11/14
(52) U.S. Cl. ........................ 365/158; 365/171; 365/173; 365/210
(58) Field of Search ................................ 365/158, 171, 365/173, 210, 230.06

(56) References Cited

U.S. PATENT DOCUMENTS

| | | |
|---|---|---|
| 5,640,343 A | 6/1997 | Gallagher et al. |
| 5,650,958 A | 7/1997 | Gallagher et al. |
| 5,734,605 A | 3/1998 | Zhu et al. |
| 5,835,314 A | 11/1998 | Moodera et al. |
| 6,097,625 A | 8/2000 | Scheuerlein |
| 6,269,018 B1 | 7/2001 | Monsma et al. |
| 6,278,631 B1 * | 8/2001 | Naji ............................ 365/158 |
| 2002/0027803 A1 | 3/2002 | Matsui |
| 2002/0041515 A1 * | 4/2002 | Ikeda et al. .................. 365/158 |

OTHER PUBLICATIONS

"A 10ns Read and Write Non–Volatile Memory Array using a Magnetic Tunnel Junction and FET Switch in Each Cell", Scheuerlein et al., ISSCC Digest of Technical Papers, TA7.2, Feb. 2000, pp. 94–95, 128–129 and 409–410.

"nonvolatile RAM based on Magnetic Tunnel Junction Elements", Durlam et al., ISSCC Digest of Technical Papers, TA7.3, Feb. 2000, pp. 96–97, 130–131 and 410–411.

* cited by examiner

*Primary Examiner*—Son Mai
(74) *Attorney, Agent, or Firm*—McDermott, Will & Emery

(57) ABSTRACT

Read word lines are disposed in correspondence with rows of memory cells arranged in a matrix, and bit lines and reference voltage lines are disposed in correspondence with the columns. A data read current is passed through a current path passing a selected memory cell, which is formed between a data read circuit and a read reference voltage via a data bus, a column selection gate, a bit line, and a reference voltage line. The data read circuit detects a voltage change occurring in the selected memory cell due to the data read current and outputs read data. A sum of an electric resistance value of the bit line and an electric resistance value of the reference voltage line in a portion included in the current path is set to be almost constant without depending on a row to which the selected memory cell belongs.

9 Claims, 21 Drawing Sheets

MEMORY DEVICE HAVING WIDE MARGIN OF DATA READING OPERATION, FOR STORING DATA BY CHANGE IN ELECTRIC RESISTANCE VALUE

This application is a divisional of application Ser. No. 09/944,346 filed Sep. 4. 2001 now U.S. Pat. No. 6,587,371.

BACKGROUND OF THE INVENTION

1. Field of the Invention

The present invention relates to a memory device and, more particularly, to a memory device typified by a thin film magnetic memory device, including a memory cell having an electric resistance value which varies according to the level of storage data.

2. Description of the Background Art

As a non-volatile memory device capable of storing data with low power consumption, attention is being paid to an MRAM (Magnetic Random Access Memory) device. The MRAM device is a non-volatile memory device for storing data by using a plurality of thin film magnetic elements formed on a semiconductor integrated circuit. Each of the thin film magnetic elements can be accessed at random.

Particularly, in recent years, it was announced that the performance of an MRAM device is dramatically improved by using a thin film magnetic element using a magnetic tunnel junction (MTJ) as a memory cell. An MRAM device including memory cells each having the magnetic tunnel junction is disclosed in technical document such as "A 10 ns Read and Write Non-Volatile Memory Array Using a Magnetic Tunnel Junction and FET Switch in each Cell", ISSCC Digest of Technical Papers, TA7.2, February 2000 and "Nonvolatile RAM based on Magnetic Tunnel Junction Elements", ISSCC Digest of Technical Papers, TA7.3, February 2000.

FIG. 20 is a schematic diagram showing the configuration of a memory cell having a magnetic tunnel junction (hereinbelow, also simply called an MTJ memory cell).

Referring to FIG. 20, the MTJ memory cell has a magnetic tunnel junction MTJ in which a resistance value changes according to the level of storage data and an access transistor ATR. The access transistor ATR takes the form of a field effect transistor and is coupled between the magnetic tunnel junction MTJ and a ground voltage Vss.

For the MTJ memory cell, a write word line WWL for instructing data writing, a read word line RWL for instructing data reading, and a bit line BL as a data line for transmitting an electric signal corresponding to the level of the storage data at the time of data reading and data writing are disposed.

FIG. 21 is a conceptual diagram for explaining an operation of reading data from the MTJ memory cell.

Referring to FIG. 21, the magnetic tunnel junction MTJ has a magnetic layer having a fixed magnetic field in a fixed direction (hereinbelow, also simply called a fixed magnetic layer) FL and a magnetic layer having a free magnetic field (hereinbelow, also simply called a free magnetic layer) VL. Between the fixed magnetic layer FL and the free magnetic layer VL, a tunnel barrier TB formed by an insulating film is disposed. In the free magnetic layer VL, according to the level of storage data, either the magnetic field in the same direction as the fixed magnetic layer or the magnetic field in the direction different from the fixed magnetic layer FL is written in a non-volatile manner.

In a data reading operation, the access transistor ATR is turned on in response to activation of the read word line RWL. By the turn-on, a sense current Is is supplied as a data read current at a fixed level is passed from a not-illustrated data read circuit to a current path constructed by the bit line BL, magnetic tunnel junction MTJ, access transistor ATR and ground voltage Vss.

The electric resistance value of the magnetic tunnel junction MTJ changes according to the relation between the magnetic field direction of the fixed magnetic layer FL and that of the free magnetic layer VL. To be specific, when the magnetic field direction of the fixed magnetic layer FL and that written in the free magnetic layer VL are the same, the electric resistance value of the magnetic tunnel junction MTJ is smaller as compared with the case where the magnetic field directions are different from each other.

In the data reading operation, therefore, a voltage drop occurring in the magnetic tunnel junction MTJ by the sense current Is varies according to the magnetic field direction stored in the free magnetic layer VL. Consequently, when the supply of the sense current Is is started after the bit line BL is once precharged to a high voltage, by detecting a change in voltage level of the bit line BL, data stored in the MTJ memory cell can be read.

FIG. 22 is a conceptual diagram for explaining a data writing operation to the MTJ memory cell.

Referring to FIG. 22, in the data writing operation, the read word line RWL is made inactive, and the access transistor ATR is turned off. In such a state, a data write current for writing the magnetic field to the free magnetic layer VL is passed to the write word line WWL and the bit line BL. The magnetic field direction of the free magnetic layer VL is determined by a combination of the direction of the data write current flowing in the write word line WWL and the direction of the data write current flowing in the bit line BL.

FIG. 23 is a conceptual diagram for explaining the relation between the direction of the data write current and the magnetic field direction in the data writing operation.

Referring to FIG. 23, a magnetic field Hx on the lateral axis indicates the direction of a magnetic field H(WWL) generated by the data write current flowing in the write word line WWL. On the other hand, a magnetic field Hy on the vertical axis denotes a direction of the magnetic field H(BL) generated by the data write current flowing in the bit line BL.

The magnetic field direction stored in the free magnetic layer VL is newly written only when the sum of the magnetic fields H(WWL) and H(BL) reaches the area outside of the asteroid characteristic line shown in the diagram. That is, in the case where the magnetic field corresponding to the area inside the asteroid characteristic line is applied, the magnetic field direction stored in the free magnetic layer VL is not updated.

Therefore, in order to update the stored data in the magnetic tunnel junction MTJ by a writing operation, a current has to be passed to both the write word line WWL and the bit line BL. The magnetic field direction once stored in the magnetic tunnel junction MTJ, that is, storage data is held in a non-volatile manner until a new data writing operation is executed.

In the data reading operation as well, the sense current Is is passed through the bit line BL. The sense current Is is, however, generally set so as to be lower than the data write current by about one or two digits, the possibility that the stored data in the MTJ memory cell is erroneously rewritten by an influence of the sense current Is in the data reading operation is low.

The above-described technical documents discloses a technique of constructing an MRAM device as a random access memory (RAM) by integrating such MTJ memory cells on the semiconductor substrate.

FIG. 24 is a diagram showing the structure of the MTJ memory cell disposed on the semiconductor substrate.

Referring to FIG. 24, the access transistor ATR is formed in the p-type area PAR on a semiconductor main substrate SUB. The access transistor ATR has source/drain areas 110 and 120 as n-type areas and a gate 130. The source/drain area 110 is coupled to the ground voltage Vss via a metal line formed in a first metal wiring layer M1. As the write word line WWL, a metal wiring formed in a second metal wiring layer M2 is used. The bit line BL is formed in a third metal wiring layer M3.

The magnetic tunnel junction MTJ is disposed between the second metal wiring layer M2 in which the write word line WWL is provided and the third metal wiring layer M3 in which the bit line BL is provided. The source/drain area 120 of the access transistor ATR is electrically coupled to the magnetic tunnel junction MTJ via a metal film 150 formed in a contact hole, the first and second metal wiring layers M1 and M2, and a barrier metal 140. The barrier metal 140 is a buffer material provided to electrically couple the magnetic tunnel junction MTJ and a metal line.

As already described, in the MTJ memory cell, the read word line RWL is provided as a line independent of the write word line WWL. A data write current to generate a magnetic field of a magnitude of a predetermined value or larger has to be passed to the write word line WWL and the bit line BL in a data writing operation. The bit line BL and the write word line WWL are formed by using metal lines.

On the other hand, the read word line RWL is provided to control the gate voltage of the access transistor ATR, so that it is unnecessary to positively pass the current to the read word line RWL. From the viewpoint of improving the integration degree, without newly providing an independent metal wiring layer, the read word line RWL is formed in the same wiring layer as the gate 130 by using a polysilicon layer, a polycide structure, or the like.

Not only the MTJ memory cell but also a memory cell whose electric resistance value varies according to the level of storage data is generally used for a ROM (Read Only Memory) or RAM.

FIG. 25 is a block diagram for explaining the supply of a data read current to MTJ memory cells arranged in a matrix with high integration degree.

Referring to FIG. 25, in order to realize a highly integrated memory device, the MTJ memory cells are generally arranged in a matrix. FIG. 25 shows a case where the MTJ memory cells are arranged in n rows and m columns (n and m: natural numbers).

As already described, the bit line BL, write word line WWL, and read word line RWL are disposed for each of the MTJ memory cells. For the (n ×m) MTJ memory cells arranged in the matrix, n write word lines WWL1 to WWLn, n read word lines RWL1 to RWLn, and m bit lines BL1 to BLm are disposed.

The data read current, that is, sense current Is at the time of data reading is supplied by a sense current supply circuit 500 disposed adjacent to the memory array. In the data reading operation, the read word line RWL corresponding to a selected memory cell row is selectively activated to the H level, and the sense current Is is supplied from the sense current supply circuit 500 to the bit line BL corresponding to the selected memory cell column. As described by referring to FIG. 21, in the selected memory cell MC, a voltage change according to the level of the stored data appears on the corresponding bit line.

In the configuration of FIG. 25, however, the length of a path through which the sense current Is passes on the bit line changes depending on the position of the selected memory cell row. There is a fear that the electric resistance value of the sense current path on the bit line changes according to the change in path length, and the value of the sense current Is fluctuates.

For example, in the configuration of FIG. 25, in the case where the n-th memory cell row close to the sense current supply circuit 500 is selected, a portion included in the sense current path (described as Isn in the drawing) on the bit line BL is short. Consequently, the electric resistance value of the sense current path is small.

On the contrary, when the first memory cell row on the side furthermost from the sense current supply circuit 500 is selected, the portion included in a sense current path (described as Is1 in the diagram) on the bit line BL is long. Consequently, the electric resistance value of the sense current path is large. Such a fluctuation in the electric resistance value of the sense current path causes a fluctuation in the sense current depending on the position of the selected memory cell row.

FIG. 26 is a block diagram showing a general configuration of the sense current supply circuit 500.

Referring to FIG. 26, generally, the sense current is supplied by a current supply unit 510 shared by the bit lines BL1 to BLm. The current supply unit 510 supplies the sense current Is to a data bus DB. The data bus DB is coupled to the bit lines BL1 to BLm via column selection gates CSG1 to CSGm.

Column selection lines CSL1 to CSLm are provided in correspondence with the memory cell columns and are selectively activated according to a column selection result. Each of the column selection gates CSG1 to CSGm is turned on when corresponding one of the column selection lines CSL1 to CSLm is activated. For example, the column selection gate CSG1 corresponding to the first memory cell column is turned on in response to activation (to the H level) of the corresponding column selection line CSL1 to thereby electrically couple the data bus DB and the bit line BL1. With respect to the subsequent memory cell columns as well, the column selection gates are similarly arranged.

With such a configuration, the current supply unit 510 is used in common by a plurality of bit lines in the memory array, and the sense current Is can be selectively supplied to the bit line corresponding to the selected memory cell column.

In the configuration of FIG. 26, however, the path length of the data bus DB for passing the sense current Is varies. There is the possibility that the electric resistance value of the sense current path on the data bus DB changes according to the change in the path length and the value of the sense current Is fluctuates.

For example, when the m-th memory cell column close to the current supply unit 510 is selected in the configuration of FIG. 26, the portion included in the sense current path on the data bus DB is short, so that its electric resistance value is small.

On the contrary, when the first memory cell column which is the furthermost from the current supply unit 510 is selected, the portion included in the sense current path on the data bus DB is long, so that its electric resistance value is large. Such a fluctuation of the electric resistance value of the sense current path causes a fluctuation in sense current depending on the position of the selected memory cell column.

In such a manner, in the MRAM device having a general configuration, the sense current may fluctuate depending on the position of the selected memory cell.

As already described, in the MRAM device having the MTJ memory cells, by detecting a voltage change which occurs according to the sense current Is and the electric resistance value of the MTJ memory cell, a data reading operation is executed. Consequently, the fluctuation in the sense current Is in the memory device having a memory cell whose electric resistance value changes according to the level of storage data, typified by the MTJ memory cell, checks a stable data reading operation.

Specifically, when the sense current fluctuates depending on the position of a selected memory cell, an operation margin in a data reading operation in the memory array cannot be maintained uniformly, and it becomes difficult to sufficiently assure the operation margin of the whole memory device. As a result, in the worst case, a problem such that an erroneous operation occurs and the yield deteriorates may arise.

In order to deal with such a problem, the level of the data read current can be finely adjusted according to the position of the selected memory cell. In this case, however, the configuration of a data read circuit becomes complicated, and a load on designing for the fine adjustment increases.

SUMMARY OF THE INVENTION

An object of the invention is to provide a memory device, typified by an MRAM device, having a memory cell whose electric resistance value changes according to the level of storage data, wherein a data read margin is maintained constant without depending on the position of a memory cell to be selected to thereby stabilize the data reading operation.

The present invention relates to, in short, a memory device having a memory array, a plurality of read word lines, a plurality of bit lines, a plurality of reference voltage lines, and a data read circuit. The memory array has a plurality of memory cells arranged in a matrix. The plurality of read word lines are provided in correspondence with rows of the memory cells and, in a data reading operation, are selectively activated in accordance with a row selection result. The plurality of bit lines are provided in correspondence with the columns of the memory cells. The plurality of reference voltage lines are disposed in correspondence with the columns in the same direction as the plurality of bit lines and supply a read reference voltage. In a data reading operation, the data read circuit supplies a data read current to be passed to a current path formed between the data read circuit and the read reference voltage to at least one of the plurality of bit lines which is selected in accordance with a column selection result. Each of the plurality of memory cells includes: a memory element whose electric resistance value changes according to a level of storage data; and a memory selection gate electrically coupled in series with the memory element between corresponding one of the plurality of bit lines and corresponding one of the plurality of reference voltage lines and turned on in response to activation of corresponding one of the plurality of read word lines. In the data reading operation, a sum of the electric resistance value in the reference voltage line and the electric resistance value of the bit line in a portion included in the current path, corresponding to a selected column, is almost constant without depending on the row selection result.

Thus, the major advantage of the invention is that, since the data read current can be maintained at a constant level without depending on the row to which the selected memory cell belongs, the operation margin in the data reading operation in the memory array can be maintained constant, and the data reading operation of the whole memory device can be stabilized.

According to another aspect of the invention, there is provided a memory device including a memory array, a plurality of read word lines, a plurality of bit lines, a plurality of reference voltage lines, a data bus, a data read circuit, a column selection portion, and a pseudo data bus. The memory array has a plurality of memory cells arranged in a matrix. The plurality of read word lines are provided in correspondence with rows of the memory cells and selectively activated in accordance with a row selection result in a data reading operation. The plurality of bit lines are provided in correspondence with columns of the memory cells. The plurality of reference voltage lines are disposed in correspondence with the columns in the same direction as the plurality of bit lines and supply a read reference voltage. The data bus is disposed in the same direction as the plurality of word lines in an area adjacent to the memory array. The data read circuit supplies a data read current to be passed to a current path formed between the data read circuit and the read reference voltage to the data bus in the data reading operation. The column selection portion electrically couples one, selected according to a column selection result, of the plurality of bit lines and the data bus. The pseudo data bus is disposed in the same direction as the data bus in an area opposite to the data bus over the memory array. The pseudo data bus is electrically coupled to the read reference voltage and each of the reference voltage lines. Each of the plurality of memory cells includes: a memory element whose electric resistance value changes according to a level of storage data; and a memory selection gate electrically coupled in series with the memory element between corresponding one of the plurality of bit lines and corresponding one of the plurality of reference voltage lines and turned on in response to activation of corresponding one of the plurality of read word lines. In the data reading operation, a sum of the electric resistance value of the data bus and the electric resistance value of the pseudo data bus in a portion included in the current path is almost constant without depending on a the column selection result.

Thus, since the data read current can be maintained at a constant level without depending on the row to which the selected memory cell belongs, the operation margin in the data reading operation in the memory array can be maintained constant, and the data reading operation of the whole memory device can be stabilized.

According to further another aspect of the invention, there is provided a memory device including a memory array, a plurality of word lines, a plurality of bit lines, a plurality of word drivers, a data bus, a data read circuit, and a column selection element. The memory array has a plurality of memory cells arranged in a matrix. The plurality of word lines are provided in correspondence with rows of the memory cells. The plurality of bit lines are provided in correspondence with column of the memory cells. The plurality of word drivers are disposed in correspondence with the plurality of word lines. Each of the plurality of word drivers couples corresponding one of the plurality of read word lines to a read reference voltage in accordance with a row selection result in the data reading operation. The data bus is disposed in the same direction as the plurality of word lines in an area adjacent to the memory array. The data read circuit supplies a data read current to be passed to a current path formed between the data read circuit and the read reference voltage to the data bus in the data reading operation. The column selection element electrically couples at least one, selected according to a column selection result, of the plurality of bit lines and the data bus. Each of the plurality of memory cells includes: a memory element whose electric resistance value changes according to a level of storage data; and a rectifying device electrically coupled in series with the memory element between corresponding one of the plurality of bit lines and corresponding one of the plurality of word lines and turned on when the corresponding word line is coupled to the read reference voltage. In the data reading operation, a sum of an electric resistance value of the read word line corresponding to the selected row and an electric resistance value of the data bus in a portion included in the current path is almost constant without depending on the column selection result.

Thus, in the memory array in which the memory cells each using the rectifying device are arranged in a matrix, adapted to higher integration degree, without depending on the column to which the selected memory cell belongs, the data read current can be maintained at a constant level. As a result, the operation margin in the data reading operation in the memory array can be kept uniform, and the higher integration degree of the memory device and stabilization in the data reading operation can be realized.

According to further another aspect of the invention, there is provided a memory device including a memory array, a plurality of word lines, a plurality of bit lines, a reference voltage line, a plurality of word drivers, and a data read circuit. The memory array has a plurality of memory cells arranged in a matrix. The plurality of word lines are provided in correspondence with rows of the memory cells. The plurality of bit lines are provided in correspondence with columns of the memory cells. The reference voltage line is disposed in the same direction as the plurality of bit lines in an area adjacent to the memory array and supplies a read reference voltage. The plurality of word drivers are disposed in correspondence with the plurality of word lines. Each of the plurality of word drivers electrically couples corresponding one of the plurality of read word lines to the reference voltage line in accordance with a row selection result in the data reading operation. The data read circuit supplies a data read current to be passed to a current path formed between the data read circuit and the read reference voltage to at least one of the plurality of bit lines selected in accordance with a column selection result. Each of the plurality of memory cells includes: a memory element whose electric resistance value changes according to a level of storage data; and a rectifying device electrically coupled in series with the memory element between corresponding one of the plurality of bit lines and corresponding one of the plurality of read word lines and turned on when the corresponding word line is coupled to the read reference voltage. In the data reading operation, a sum of an electric resistance value of the bit line corresponding to the selected column and an electric resistance value of the reference voltage line in a portion included in the data read current path is almost constant without depending on a result of the row selection.

Thus, in the memory array in which the memory cells each using the rectifying device are arranged in a matrix, adapted to higher integration degree, without depending on the row to which the selected memory cell belongs, the data read current can be maintained at a constant level. As a result, the operation margin in the data reading operation in the memory array can be kept uniform, and the higher integration degree of the memory device and stabilization in the data reading operation can be realized.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
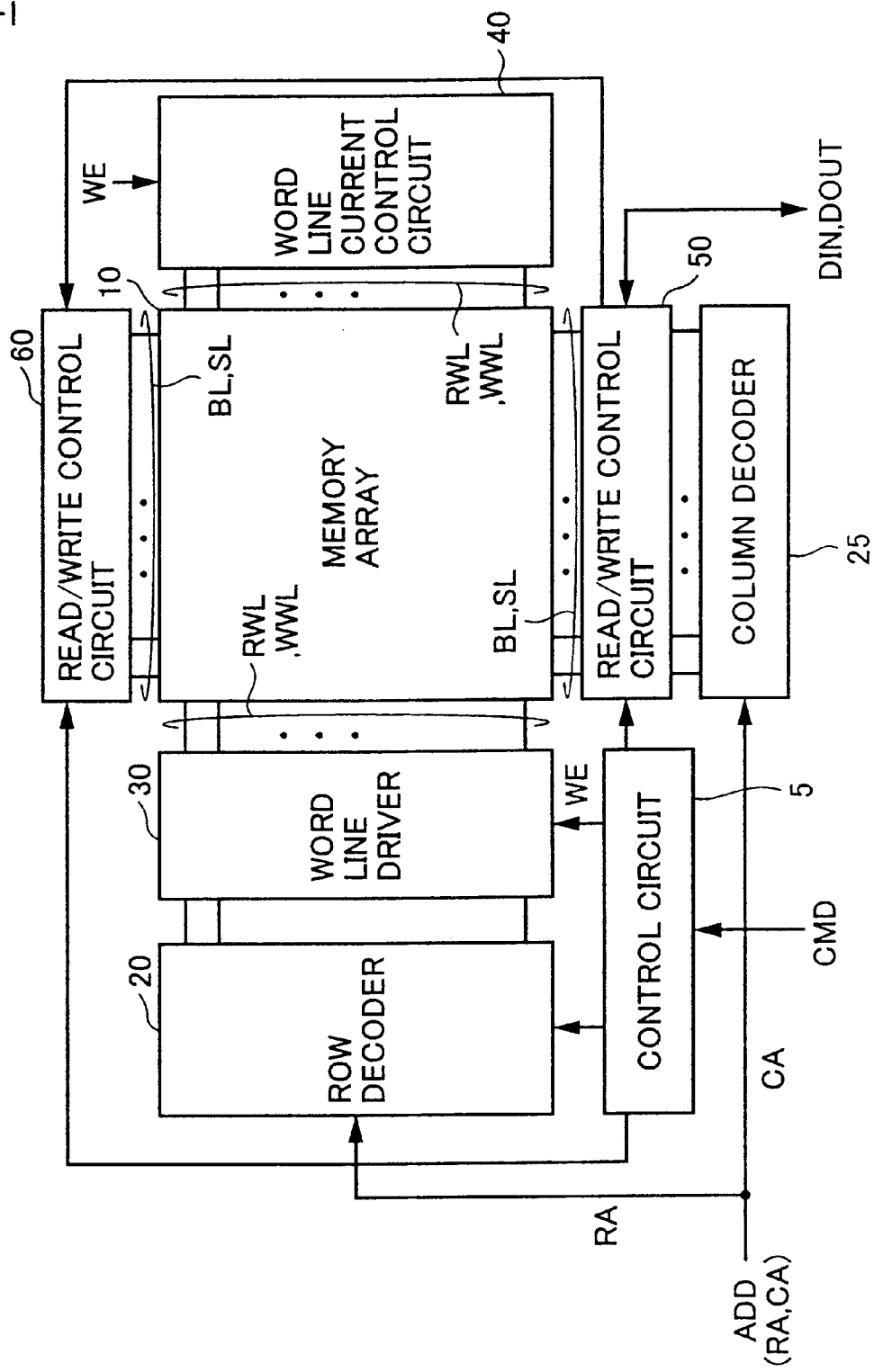
FIG. 1 is a schematic block diagram showing the configuration of a whole MRAM device according to a first embodiment of the invention.

Embodiments of the invention will be described in detail hereinbelow with reference to the drawings. The same reference numeral denotes the same or corresponding component.

First Embodiment

Referring to FIG. 1, an MRAM device 1 is shown as a representative example of a memory device according to the present invention. As will become apparent from the following description, the invention is not limited to the MRAM device but can be applied to a memory device having a memory cell of which electric resistance value changes according to the level of storage data.

The MRAM device 1 according to the first embodiment is accessed at random in response to a control signal CMD and an address signal ADD from the outside, receives write data DIN, and outputs read data DOUT.

The MRAM device 1 has a control circuit 5 for controlling the overall operation of the MRAM device 1 in response to the control signal CMD and a memory array 10 having a plurality of MTJ memory cells arranged in a matrix. The configuration of the memory array 10 will be described in detail hereinafter. Briefly, the plurality of write word lines WWL and read word lines RWL are arranged in correspondence with the rows of the MTJ memory cells. A plurality of bit lines BL are arranged in correspondence with the columns of the MTJ memory cells.

The MRAM device 1 further has: a row decoder 20 for selecting a row in the memory array 10 in accordance with a row address RA indicated by the address signal ADD; a column decoder 25 for selecting a column in the memory array 10 in accordance with a column address CA indicated by the address signal ADD; a word line driver 30 for selectively activating the read word line RWL and the write word line WWL on the basis of the result of row selection of the row decoder 20; a word line current control circuit 40 for passing a data write current to the write word line WWL in a data writing operation; and read/write control circuits 50 and 60 for passing the data write current and a sense current in data reading and writing operations.

The read/write control circuits 50 and 60 control the voltage level of the bit line BL at both ends of the memory array 10 and pass the data write current and the sense current for executing the data writing and reading operations, respectively, to the bit line BL.

Figure 2:
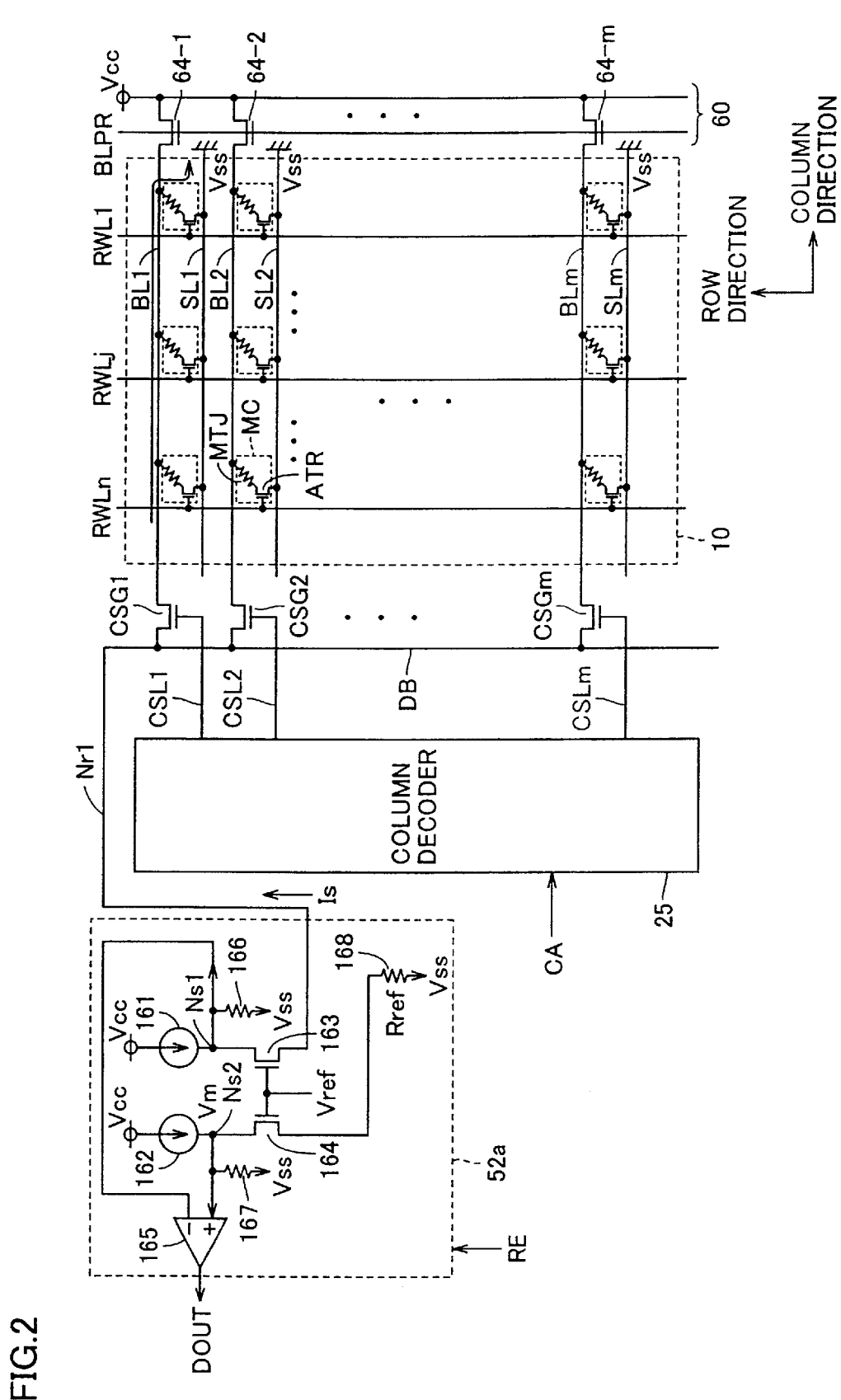
FIG. 2 is a diagram for explaining in detail the configuration related to a data reading operation of a memory array and peripheral circuits of the memory array in accordance with the first embodiment.

Referring to FIG. 2, the memory array 10 has memory cells MC arranged in n rows and m column (n and m: natural numbers).

Figure 20:
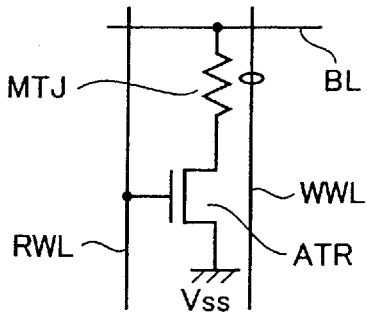
FIG. 20 is a schematic diagram showing the configuration of a memory cell having a magnetic tunnel junction.
Figure 21:
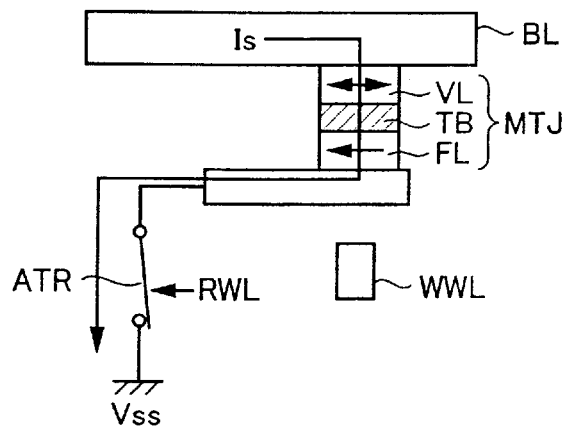
FIG. 21 is a conceptual diagram for explaining operation of reading data from an MTJ memory cell.
Figure 22:
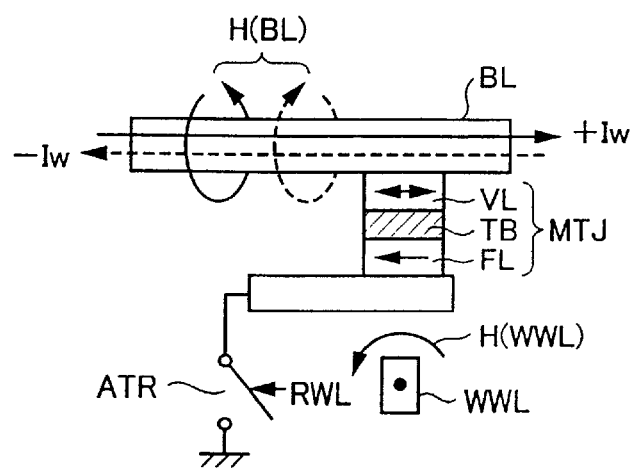
FIG. 22 is a conceptual diagram for explaining operation of writing data to the MTJ memory cell.
Figure 23:
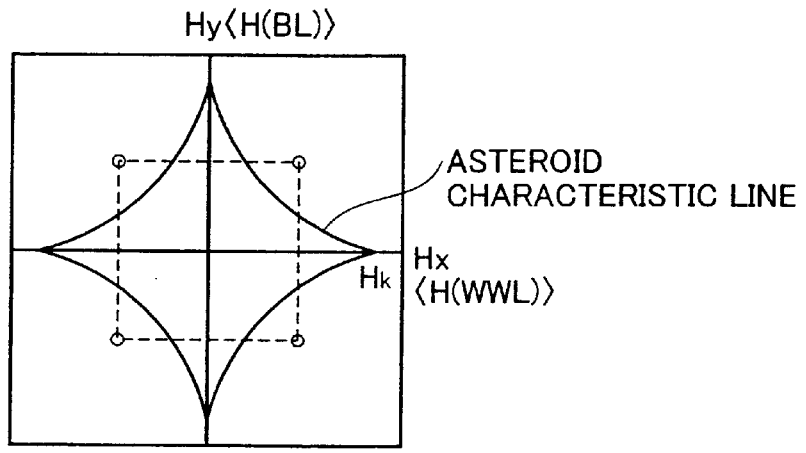
FIG. 23 is a conceptual diagram for explaining the relation between the direction of a data write current and the magnetic field direction at the time of writing data to the MTJ memory cell.
Figure 24:
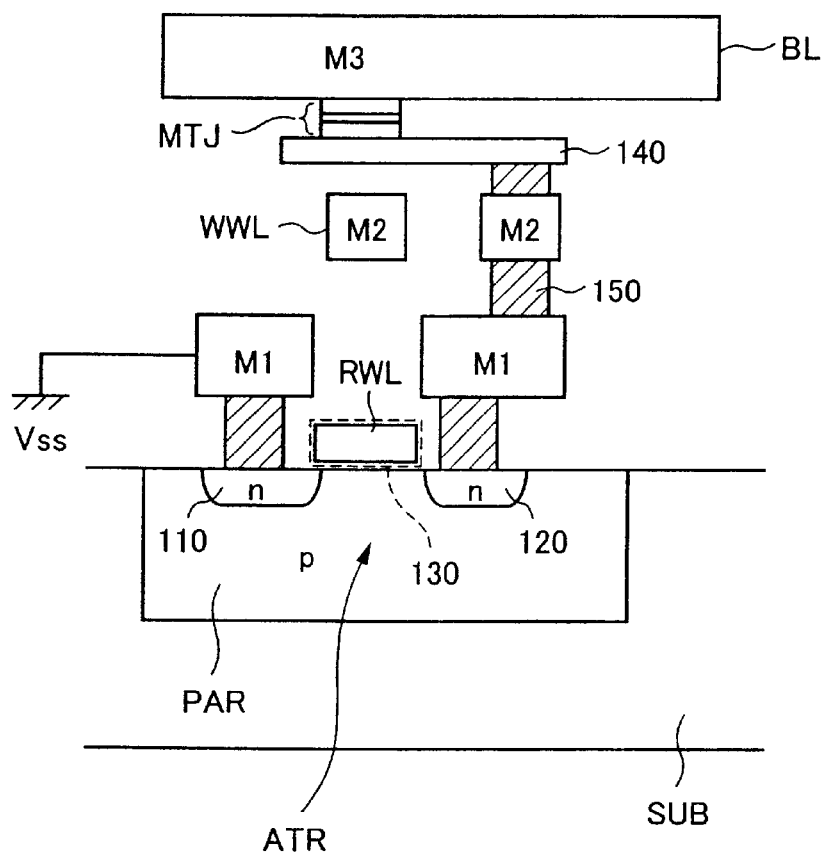
FIG. 24 is a diagram showing the structure of the MTJ memory cell disposed on the semiconductor substrate.
Figure 25:
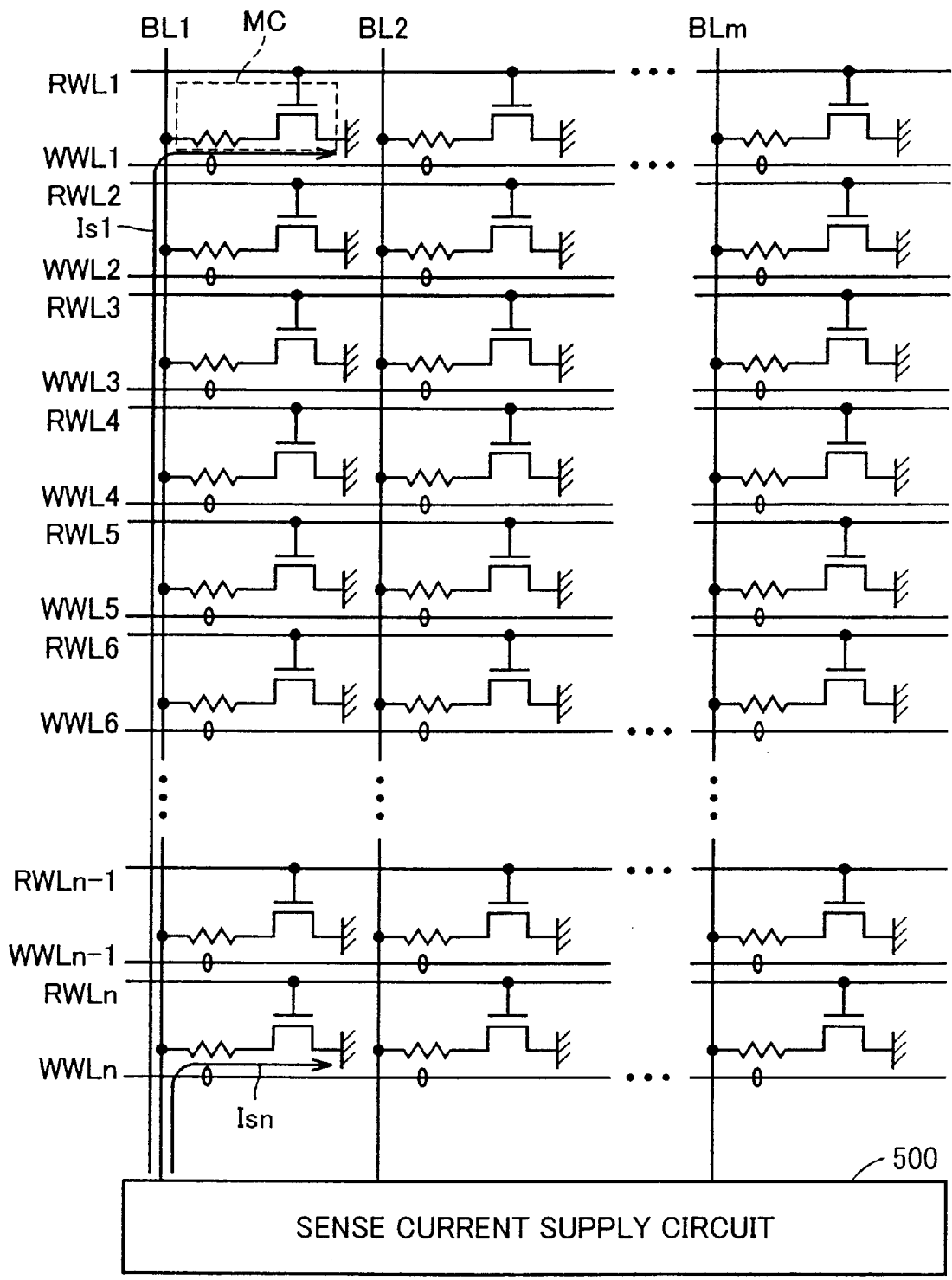
FIG. 25 is a block diagram for explaining supply of a data read current to the MTJ memory cells disposed in a matrix with high integration degree.
Figure 26:
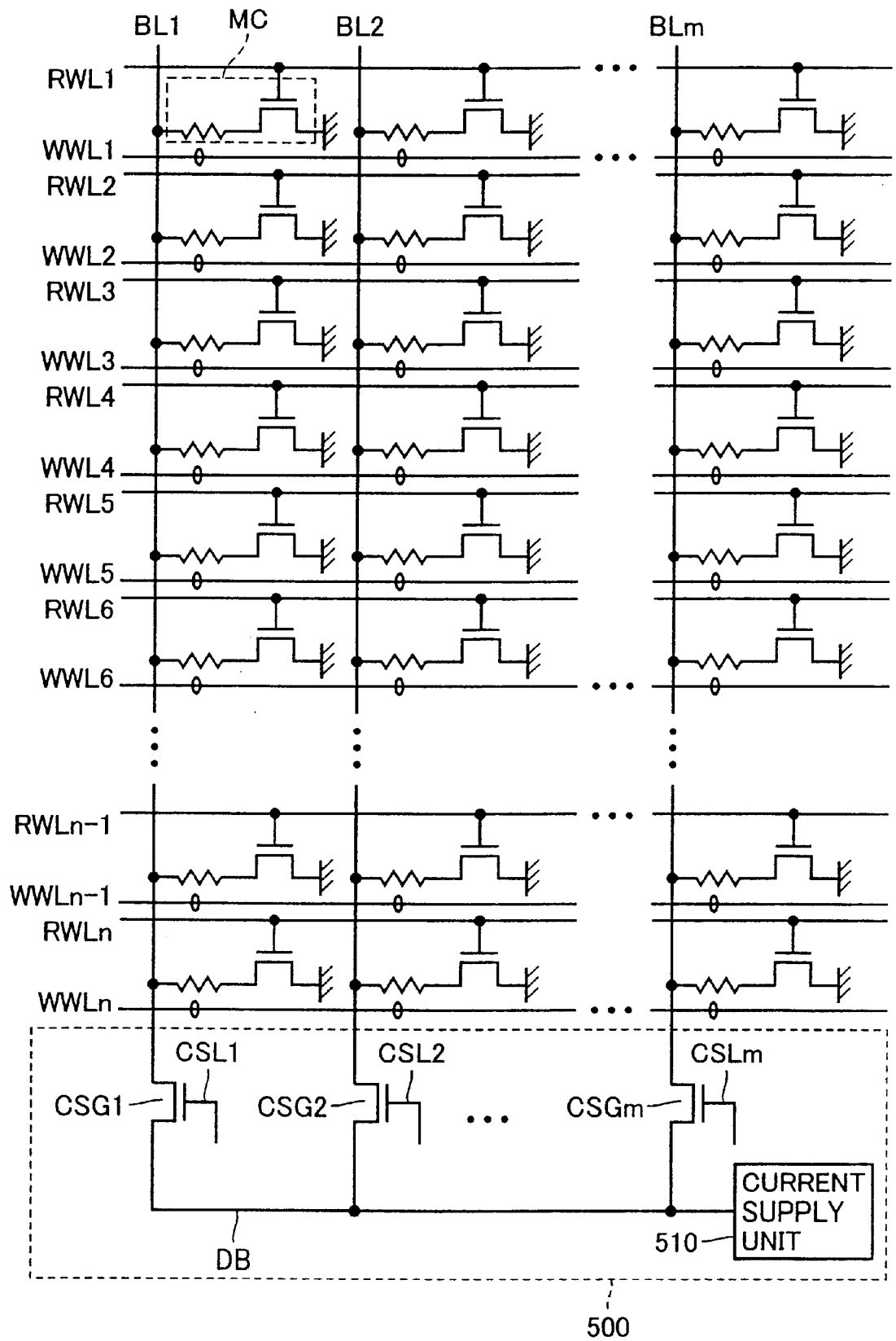
FIG. 26 is a block diagram showing a general configuration of a sense current supply circuit.

In the embodiment, the configuration of each memory cell MC is similar to that of the MTJ memory cell shown in FIG. 20. A portion corresponding to the magnetic tunnel junction MTJ in each memory cell can be replaced by a device whose electric resistance value changes according to the level of stored data.

In correspondence with the rows of the memory cells (hereinbelow, also simply called memory cell rows), read word lines RWL1 to RWLn are disposed. Although not shown, write word lines WWL1 to WWLn for passing the data write current in correspondence with the selected memory cell row in a data writing operation are also arranged in correspondence with the memory cell rows.

Bit lines BL1 to BLm and reference voltage lines SL1 to SLm are arranged in correspondence with the columns of memory cells (hereinbelow, also simply called memory cell columns). Each of the reference voltage lines SL1 to SLm is coupled to the ground voltage Vss corresponding to the reference voltage in a data reading operation (hereinbelow, also simply called a read reference voltage) on the read/write control circuit 60 side, and is further coupled to each of areas on the source side of the access transistors ATR in the memory cells belonging to the corresponding memory cell column.

In the following, when the read word line and the bit line are expressed generically, they will be described by reference characters RWL and BL, respectively. In the case of referring to specific read word line and bit line, they will be described by adding a numeral to the reference characters like RWL1 and BL1.

Around the memory array 10, in correspondence with the memory cell columns, column selection lines CSL1 to CSLm, column selection gates CSG1 to CSGm, and precharge transistors 64-1 to 64-m are provided. Further, the data bus DB extends in the same direction as the read word line RWL.

The column decoder 25 decodes the column address CA and activates one of the column selection lines CSL1 to CSLm to a selected state (H level) in accordance with the result of column selection.

The column selection gates CSG1 to CSGM are provided in the read/write control circuit 50 and disposed between the bit lines BL1 to BLm and the data bus DB. Each of the column selection gates CSG1 to CSGm is turned on in response to the activation of corresponding one of the column selection lines CSL1 to CSLm and couples the data bus DB to the corresponding bit line BL. That is, the bit line BL and the data bus DB are electrically coupled on the read/write control circuit 50 side.

In the following, when the column selection line, column selection gate, and precharge transistor are expressed generically, they will be described by reference characters and reference numerals like CSL, CSG, and 64, respectively. In the case of referring to specific column selection line, column selection gate, and precharge transistor, they will be described by adding a numeral to each of the reference characters/numerals like CSL1, CSG1, and 64-1, respectively.

The precharge transistors 64-1 to 64-m are provided in the read/write control circuit 60, and electrically coupled between the power supply voltage Vcc used as a precharge voltage and the bit lines BL1 to BLm. Each of the precharge transistors 64-1 to 64-m is turned on in response to a bit line precharge signal BLPR.

In response to the activation of the bit line precharge signal BLPR, each bit line BL is precharged to the power supply voltage Vcc.

The bit line precharge signal BLPR is activated to precharge each bit line before and after the data writing operation and data reading operation in a standby period of the MRAM device 1 and in an active period of the MRAM device 1.

On the other hand, in the data writing and reading operations in the active period of the MRAM device 1, the bit line precharge signal BLPR is inactivated to the L level. In response to this, each of the bit lines BL is disconnected from the precharge voltage.

The configuration of a data read circuit 52a included in the read/write control circuit 50 will now be described.

The data read circuit 52a operates in response to a control signal RE activated at the time of data reading, supplies the sense current Is as a data read current, detects a voltage change caused in a selected memory cell by the sense current Is, and outputs read data DOUT.

The data read circuit 52a has: current sources 161 and 162 for receiving the power supply voltage Vcc and supplying a constant current to nodes Ns1 and Ns2, respectively; an n-type MOS transistor 163 electrically coupled between the nodes Ns1 and Nr1; an n-type MOS transistor 164 and a resistor 168 coupled in series between a node Ns2 and the ground voltage Vss; and an amplifier 165 for amplifying a voltage level difference between the nodes Ns1 and Ns2 and outputting the read data DOUT. The node Nr1 is electrically coupled to the data bus DB.

A predetermined voltage Vref is applied to the gates of the transistors 163 and 164. The supply current amounts of the current sources 161 and 162 and the predetermined voltage Vref are set according to a design value of the sense current Is. Resistors 166 and 167 are provided to pull down the nodes Ns1 and Ns2 to the ground voltage Vss.

With such a configuration, the data read circuit 52a supplies a constant sense current Is to the data bus DB in a data reading operation. In the data reading operation, in correspondence with the selected memory cell, the sense current Is is passed to a current path formed between the data read circuit 52a and the ground voltage Vss as a read reference voltage. The current path is constructed by the data read circuit 52a, data bus DB, column selection gate CSG, bit line BL, magnetic tunnel junction MTJ, access transistor ATR, reference voltage line SL, and ground voltage Vss (read reference voltage).

Accordingly, a voltage change which occurs in the magnetic tunnel junction MTJ in the memory cell MC can be transmitted to the node Nr1 via the bit line BL and the data bus DB.

When a voltage at the node Nr1 in the case where data stored in the selected memory cell is H level ("1") data is Vh and a voltage at the node Nr1 in the case where data stored in the selected memory cell is L level ("0") data is Vl, the voltage at the node Ns2 is set to a voltage Vm as an intermediate voltage of the voltages Vh and Vl. That is, the voltage Vm is adjusted by the resistance value of the resistor 168.

The data read circuit 52a amplifies a voltage difference between the nodes Ns1 and Ns2, detects and amplifies a voltage change in a selected memory cell according to the level of stored data, and outputs read data DOUT.

An area in which the reference voltage line SL is coupled to the ground voltage Vss and an area in which the sense current Is is supplied to the bit line BL are positioned on the sides opposite to each other in the column direction over the memory array 10.

Figure 3:
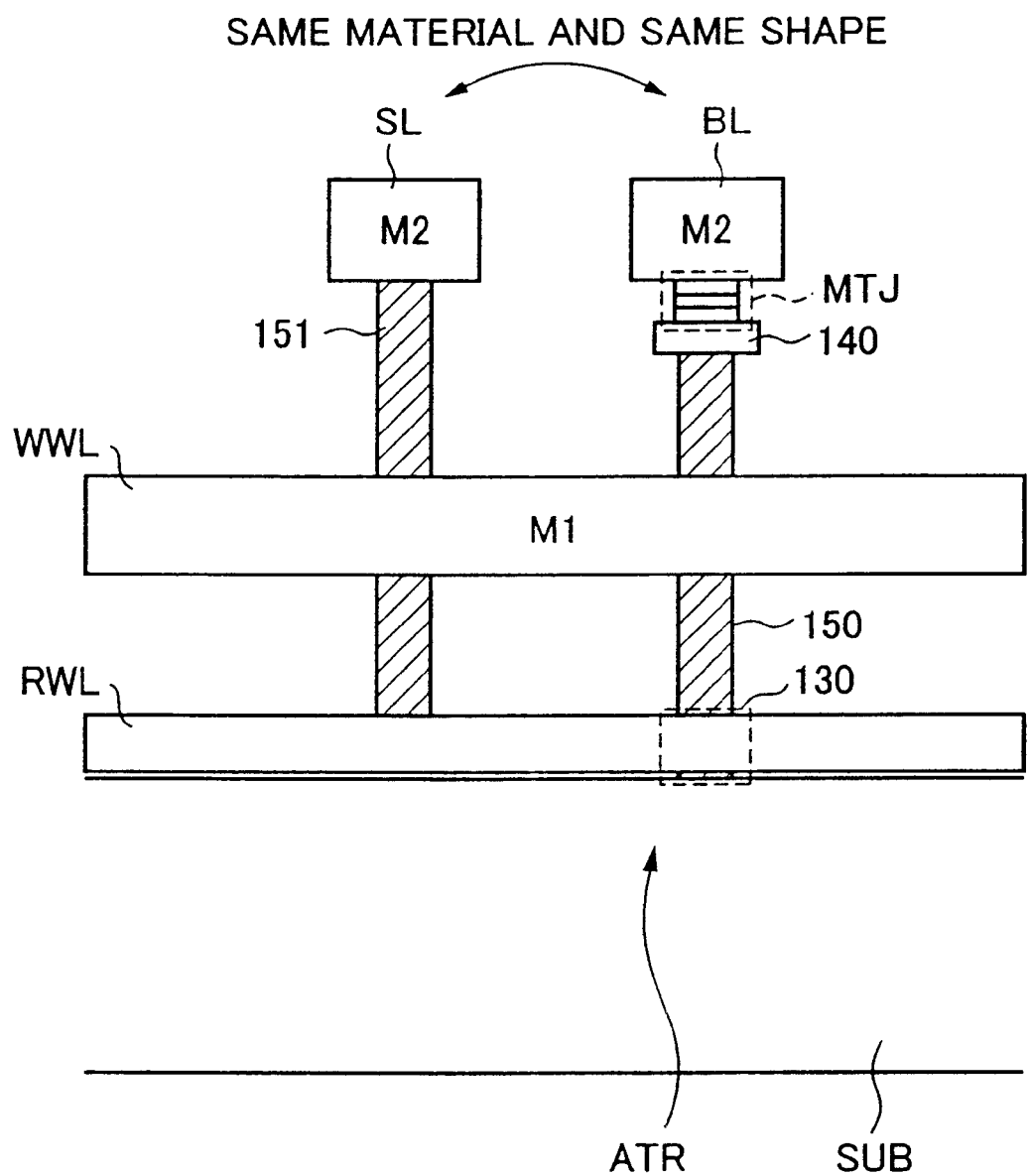
FIG. 3 is a structural diagram showing an example of layout of a bit line and a reference voltage line in accordance with the first embodiment.

Referring to FIG. 3, the reference voltage line SL is formed in the same shape and the same material as those of the bit line BL in the same wiring layer (for example, M2) in which the bit line BL is also formed. Consequently, the electric resistance value per unit length of the reference voltage line SL and that of the bit line BL are set to similar values.

The reference voltage line SL and the bit line BL are formed as described above and, as shown in FIG. 2, the coupling portion between each of the reference voltage lines SL and the ground voltage Vss and the coupling portion between the data bus DB to which the sense current Is is supplied and each of the bit lines BL (that is, the column selection gate CSG) are provided on one end side of the memory array and on the side opposite to the one end side (the other end side), thereby enabling the sum of the resistance value of the bit line B1 and the resistance value of the reference voltage line SL included in the path of the sense current Is to be maintained almost constantly irrespective of the position of the selected memory cell row.

The sense current Is can be therefore prevented from being fluctuated depending on the selected memory cell row. As a result, the operation margin in the data reading operation can be maintained uniformly in the memory array, and the operation margin in the whole MRAM device can be sufficiently assured.

The reference voltage line SL has to be designed so that its resistance value per unit length is similar to that of the bit line BL. As long as the condition is satisfied, the lines can be provided in different metal wiring layers.

The operation of reading/writing data from/to a memory cell will now be described by referring to FIG. 4.

First, the data writing operation will be described.

In FIG. 2, the layout and configuration of peripheral circuits related to the data writing operation are not shown. By controlling the voltage and current of the write word line WWL and the bit line BL arranged in correspondence with the memory cell row as follows, the data writing operation can be executed.

The word line driver 30 drives the voltage of the write word line WWL corresponding to the selected row to the selection state (H level) in accordance with the result of row selection of the row decoder 20. For non-selected rows, the voltage level of the write word line WWL remains a non-selected state (L level, that is, ground voltage Vss).

In the data writing operation, the data write current Ip is passed through the write word line WWL corresponding to the selected row. On the other hand, to the not-selected rows, the data write current is not passed.

By controlling the voltages of the bit line BL at both ends of the memory array 10, the read/write control circuits 50 and 60 generate a data write current in the direction according to the level of the write data. For example, in the case of writing storage data of "1", a bit line voltage on the read/write control circuit 60 side is set to a high voltage state (power supply voltage Vcc), and a bit line voltage on the read/write control circuit 50 on the opposite side is set to a low voltage state (ground voltage Vss). By the setting, a data write current +Iw is passed through the bit line BL in the direction from the read/write control circuit 60 to the read/write control circuit 50. On the other hand, in the case of writing storage data of "0", the bit line voltages on the sides of the read/write control circuits 50 and 60 are set to the high voltage state (power supply voltage Vcc) and the low voltage state (ground voltage Vss), respectively, thereby passing a data write current −Iw through the bit line BL in the direction from the read/write control circuit 50 to the read/write control circuit 60.

At this time, it is unnecessary to pass the data write current ±Iw to each of the bit lines. It is sufficient for the read/write control circuits 50 and 60 to control the voltage of the bit line BL so as to selectively pass the data write current ±Iw to a part of the bit lines corresponding to the selected column via the data bus DB and the column selection gates CSG1 to CSGm.

The data reading operation will now be described.

As described in FIG. 2, prior to the data reading operation, each of the bit lines BL is precharged to the power supply voltage Vcc. The data bus DB is similarly precharged to the power supply voltage Vcc.

In the data reading operation, the word line driver 30 drives the read word line RWL corresponding to the selected row to the selected state (H level) in accordance with the result of row selection of the row decoder 20. In the selected row, the voltage of the read word line RWL remains to be in the non-selected state (L level: ground voltage Vss). A dummy read word line corresponding to a dummy memory cell which will be described hereinlater is also driven in accordance with the row selection result.

When the read word line RWL is activated to the H level in the selected memory cell row, the corresponding access transistor ATR is turned on, and the magnetic tunnel junction MTJ is pulled down to the ground voltage Vss. On the other hand, in the selected memory cell column, a constant sense current Is is passed to the corresponding bit line BL via the column selection gate CSG and the data bus DB.

The bit line BL and the data bus DB corresponding to the selected memory cell therefore converge to a voltage (Vh or Vl) corresponding to the electric resistance value of the magnetic tunnel junction MTJ according to the storage data level. Since memory cells belonging to the not-selected memory cell columns out of the memory cells belonging to the selected memory cell row are not coupled to the data base DB, the voltage of the bit line BL decreases to the ground voltage Vss.

In such a data reading operation, the variation in electric resistance value of the memory cell MC according to the storage data level is converted to a voltage difference. The voltage difference is detected and amplified. In such a manner, the data reading operation can be executed.

The data reading operation can be also executed by using the ground voltage Vss as the precharge voltage of the bit line BL.

Figure 5:
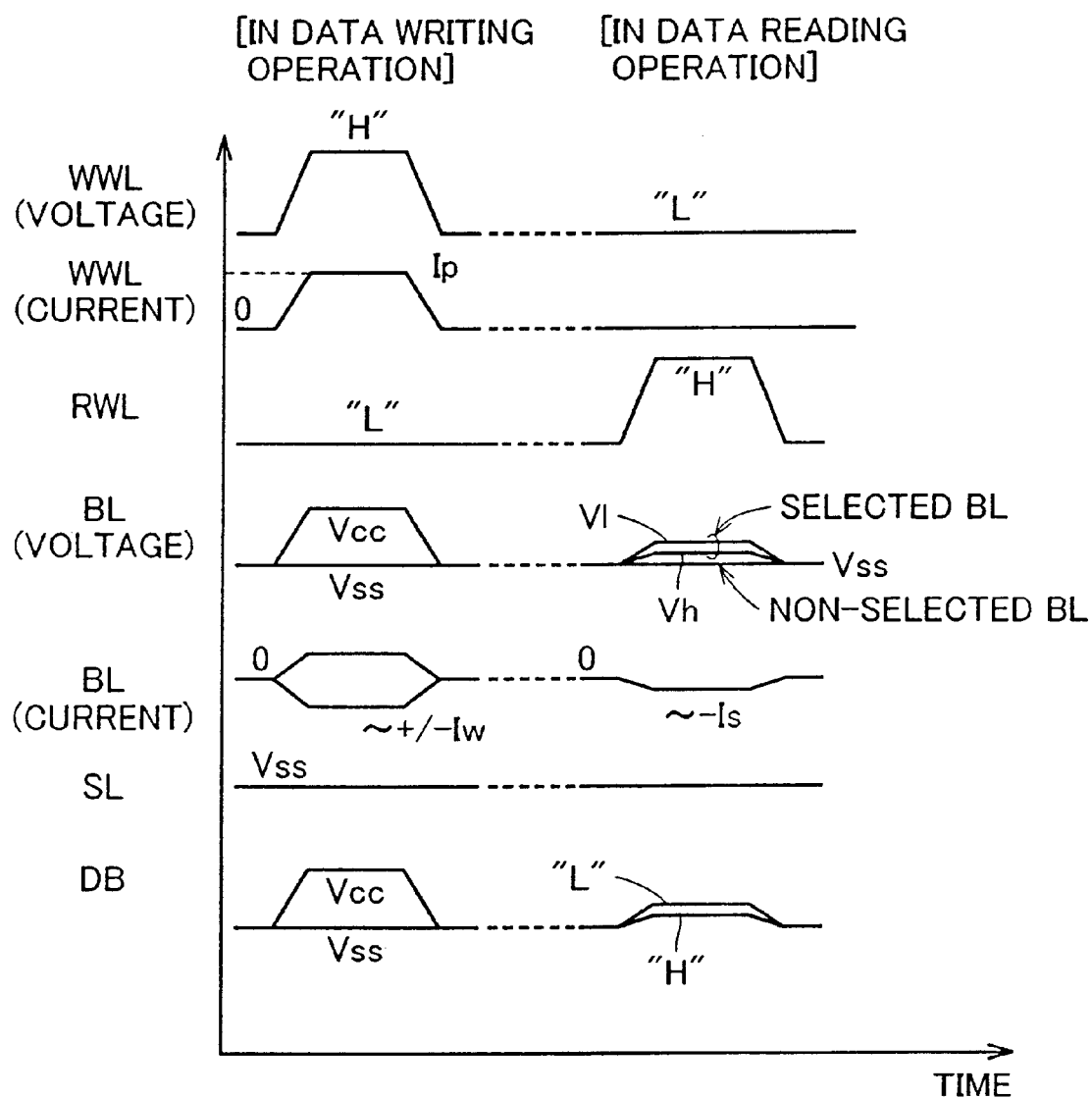
FIG. 5 is a timing chart for explaining the data reading/writing operations in the case where the ground voltage is used as a precharge voltage.

FIG. 5 is a timing chart for explaining the operation of reading/writing data from/to a memory cell in the case where the ground voltage Vss is used as the precharge voltage.

Figure 4:
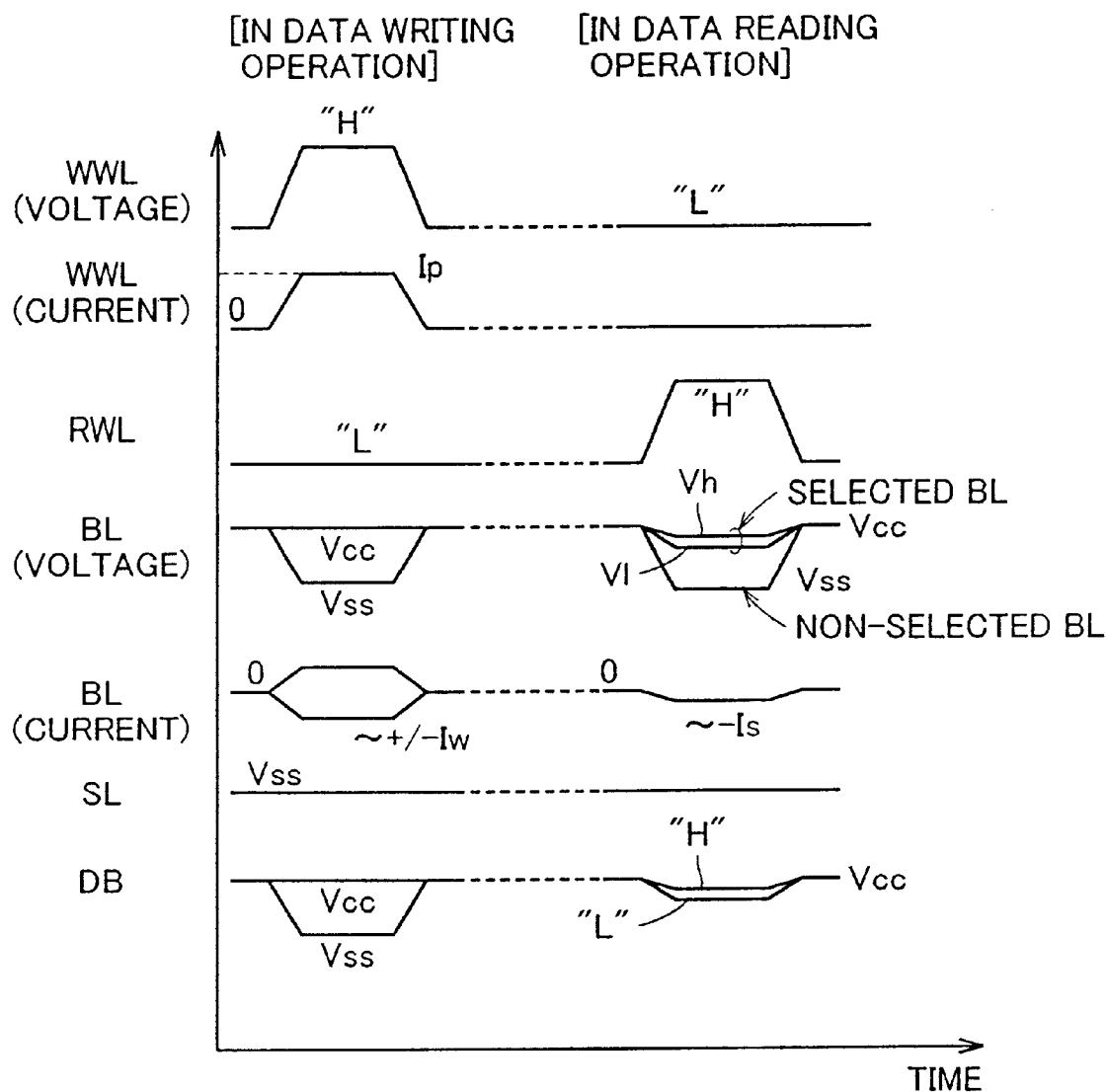
FIG. 4 is a timing chart for explaining operations of reading/writing data from/to a memory cell.

FIG. 5 is different from FIG. 4 with respect to the point that, in the data writing operation, the ground voltage Vss is set as a set voltage of the data bus DB after the data writing operation is finished to prepare for the precharge in the data reading operation. As the voltages and current waveforms of the other signal lines are similar to those shown in FIG. 4, the detailed description will not be repeated.

Before the data reading operation, the bit line BL and the data bus DB are precharged to the ground voltage Vss.

In the data reading operation, the bit line BL corresponding to the selected memory cell column is pulled up by the data read circuit 52*a* and receives the supply of the sense current Is via the column selection gate CSG and the data bus DB. On the other hand, the bit line corresponding to the non-selected memory cell column is maintained at the ground voltage Vss.

In the bit line BL and the data bus DB corresponding to the selected memory cell, a voltage change (rise) according to the level of the storage data occurs. As a result, in a manner similar to the case of FIG. 4, the bit line BL and the data bus DB converge to a voltage corresponding to the electric resistance value of the magnetic tunnel junction MTJ according to the level of the storage data. Consequently, a variation in the electric resistance value of the memory cell in which the level of the storage data is reflected can be converted to a voltage difference, and the data reading operation can be executed.

As described by referring to FIGS. 4 and 5, the data reading operation can be executed when the power supply voltage Vcc or the ground voltage Vss is used as the precharge voltage of the bit line BL and the data bus DB before the data reading operation.

When the ground voltage Vss is used as a precharge voltage, the sense current Is flows only in the selected bit line BL. It is unnecessary to pass a charge current for precharging and its discharge current to the not-selected bit lines BL. Thus, the power consumption can be reduced.

On the other hand, when the power supply voltage Vcc is used as a precharge voltage, although the power consumption increases relatively, the voltage change in the bit line BL and the data bus DB can be promptly created. Consequently, the data reading operation can be performed at higher speed. It is therefore sufficient to set the precharge voltage in consideration of such characteristics.

First Modification of First Embodiment

Figure 6:
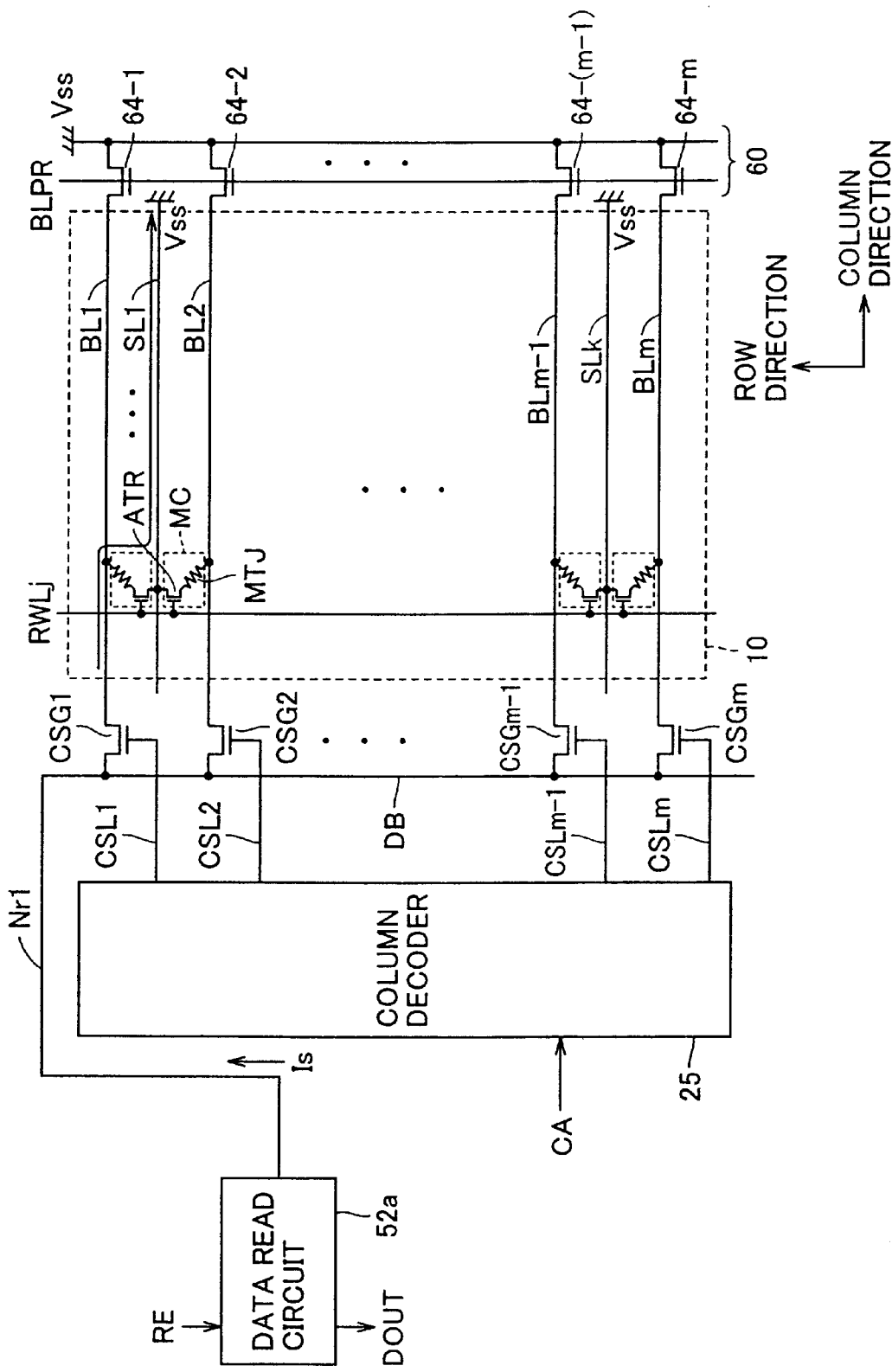
FIG. 6 is a diagram for explaining in detail the configuration related to a data reading operation of a memory array and its peripheral circuits according to a first modification of the first embodiment.

Referring to FIG. 6, the configuration according to a first modification of the first embodiment is different from that of the first embodiment shown in FIG. 2 with respect to the point that the reference voltage line SL is shared by memory cells which are neighboring in the row direction. For example, the memory cells belonging to the first and second memory cell columns corresponding to the bit lines BL1 and BL2, respectively, share the same reference voltage line SL1. For the other memory cell columns as well, the reference voltage lines SL are arranged similarly. In the whole memory array 10, therefore, k (natural number expressed by m/2) reference voltage lines SL1 to SLk are arranged.

FIG. 6 representatively shows a read word line RWLj corresponding to a j-th memory cell row 0: natural number from 1 to n) and a part of memory cells corresponding to the read word line RWLj out of the memory cells MC arranged in a matrix in the memory array 10. In the other memory cell rows and memory cell columns, the read word lines and memory cells MC are arranged similarly. In the subsequent drawings as well, the memory array 10 has a similar configuration.

The precharge transistors 64-1 to 64-m precharge the corresponding bit lines BL1 to BLm, respectively, to the ground voltage Vss in response to the bit line precharge signal BLPR.

Also in the case where a corresponding read word line RWL is made active by setting the precharge voltage of the bit line BL to the same value as the ground voltage Vss supplied as a read reference voltage, no current is passed to the bit lines BL corresponding to the not-selected memory cell columns, so that the reference voltage line SL can be shared. As a result, the number of signal lines can be reduced, and the integration degree of the memory array 10 can be further increased.

Since the configuration and operation of the other portion are similar to those in the first embodiment, their detailed description will not be described.

Since each of the reference voltage lines SL shared by the neighboring memory cell lines and each of the bit lines BL are formed so that their electric resistance values per unit length become uniform in a manner similar to the first embodiment, the operation margin in the data reading operation can be uniformly maintained in the memory array, and the operation margin of the whole MRAM device can be sufficiently assured.

Second Modification of First Embodiment

Figure 7:
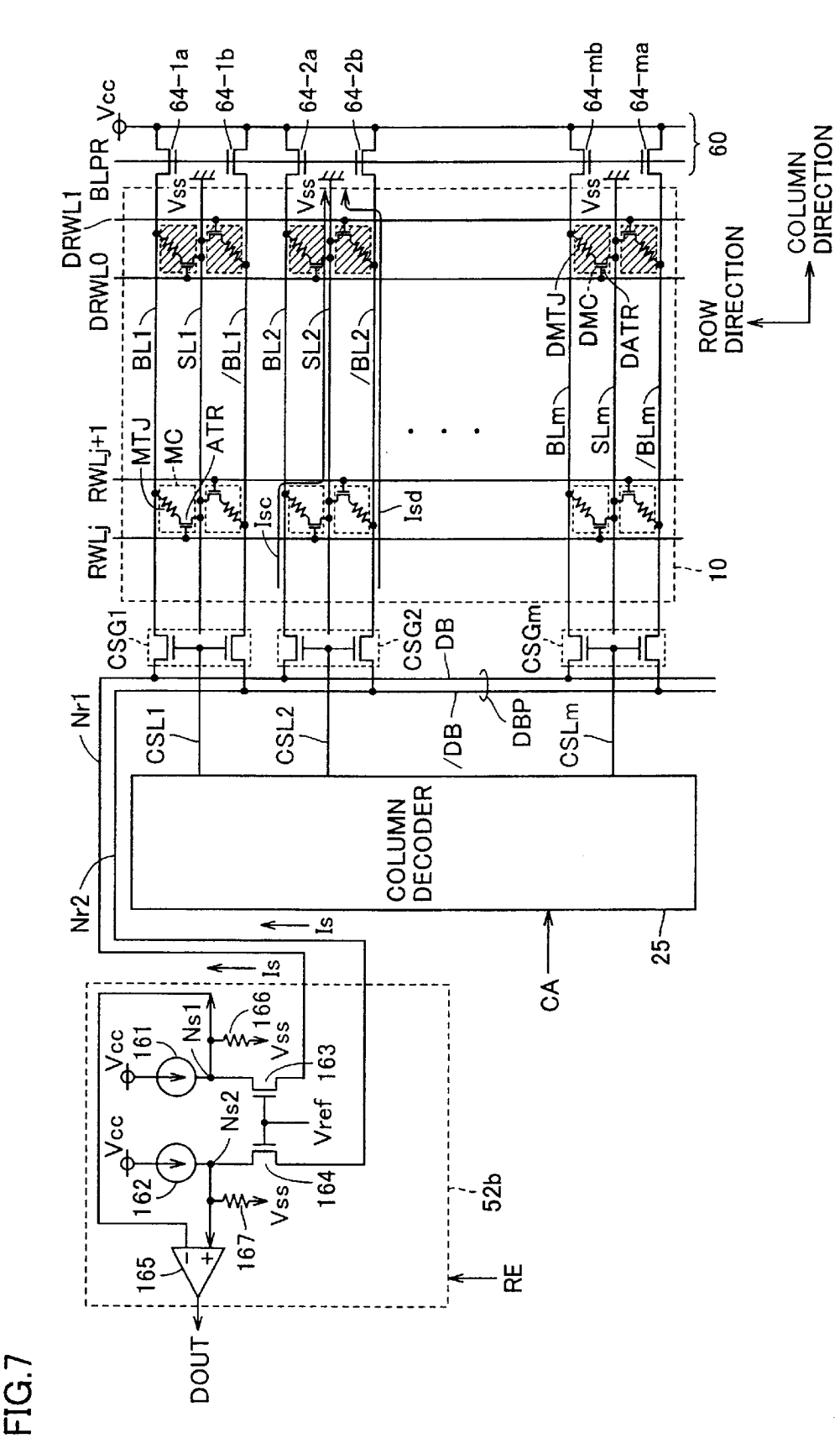
FIG. 7 is a diagram for explaining in detail the configuration related to a data reading operation of a memory array and its peripheral circuits according to a second modification of the first embodiment.

Referring to FIG. 7, in the configuration according to a second modification of the first embodiment, the bit lines BL are arranged according to a folded type configuration.

In the memory array 10, in correspondence with the memory cell columns, the bit lines /BL1 to /BLm complementary to the bit lines BL1 to BLm are further disposed. The bit lines BL1 and /BL1 construct a bit line pair. In the other memory cell columns as well, bit line pairs are similarly constructed.

Each of the bit lines /BL1 to /BLm is disposed so that its electric resistance value per unit length is similar to that of each of the bit lines BL1 to BLm, in a manner similar to the bit lines BL and the reference voltage lines SL in the first embodiment.

The bit lines BL1 to BLm and /BL1 to /BLm each serving as one or the other one of the pair of bit line will be also generically called as bit lines BL and /BL.

Each of the reference voltage lines SL1 to SLm is disposed in correspondence with neighboring memory cell columns and shared by memory cells belonging to the neighboring memory cell columns.

Each of the reference voltage lines SL1 to SLm is disposed in a manner similar to the first embodiment so that its electric resistance value per unit length is similar to that of each of the bit lines BL1, /BL1 to BLm and /BLm.

The memory cell MC is coupled with either any of the bit lines BL1 to BLm or any of the bit lines /BL1 to /BLm to every other row. For example, the memory cells belonging to the j-th memory cell row are coupled to the bit lines BL1 to BLm and memory cells belonging to the (j+1)th memory cell row are coupled to the bit lines /BL1 to /BLm.

As a result, when the read word line RWL is selectively activated according to the result of row selection, the bit lines BL1 to BLm or the other bit lines /BL1 to /BLm in the bit line pairs are coupled to the MTJ memory cells MC.

The memory array 10 has a plurality of dummy memory cells DMC provided so as to form a dummy row in correspondence with the bit lines BL1 and /BL1 to BLm and /BLm.

Each of the dummy memory cells DMC has a dummy memory element DMTJ and an access transistor DATR.

The dummy memory cell DMC is selected by either the dummy read word line DRWL0 or DRWL1. A dummy memory cell group selected by the dummy read word line DRWL0 has the access transistors DATR which are turned on in response to the activation of the dummy read word line DRWL0. In response to the activation of the dummy read word line DRWL0, the dummy memory element DMTJ is electrically coupled between each of the bit lines BL1 to BLm and each of the reference voltage lines SL1 to SLm.

On the other hand, the other group of dummy memory cells selected by the dummy read word line DRWL1 has the access transistors DATR which are turned on in response to the activation of the dummy read word line DRWL1. In response to the activation of the dummy read word line DRWL1, the dummy memory element DMTJ is electrically coupled between each of the bit lines /BL1 to /BLm and each of the reference voltage lines SL1 to SLm.

The dummy read word lines DRWL0 and DRWL1 are selectively activated by the word line driver 30 so that the bit lines BL1 to BLm or /BL1 to /BLm of the bit line pairs, which are not connected to the memory cells MC belonging to the selected memory cell row, are coupled to the dummy memory cells DMC. As a result, the bit lines BL1 to BLm and the other bit lines /BL1 to /BLm of the bit line pairs are complementarily coupled to the m MTJ memory cells corresponding to the selected memory cell row and m dummy memory cells, respectively.

As described above, the electric resistance value of the memory cell MC changes according to the level of the storage data. When the electric resistance value of the MTJ memory cell in the case where the H level ("1") data is stored is set as Rh and that of the memory cell MC in the case where the L level ("0") data is stored is set as Rl, an electric resistance value Rd of the dummy memory element DMTJ is set to an intermediate value of Rl and Rh. Consequently, by comparing a voltage change occurring in a bit line coupled to the dummy memory cell DMC with a voltage change occurring in a bit line coupled to the memory cell, the level of stored data to be read in the selected memory cell can be read.

Further, the data bus DB and its complementary data bus /DB are arranged. The data buses DB and /DB construct a data bus pair DBP.

The data bus /DB is disposed in a manner similar to the reference voltage line SL with respect to the bit lines BL in the first embodiment so that its electric resistance value per unit length becomes similar to that of the data bus DB.

Each of the column selection gates CSG1 to CSGm has two transistor switches electrically coupled between the data busses DB and /DB and corresponding bit lines BL and /BL. The transistor switches are turned on in response to the activation of the corresponding column selection line CSL. Consequently, the sense current Is is supplied from a data read circuit 52b via the data buses DB and /DB and the column selection gate CSG to each of the bit lines BL and /BL constructing the bit line pair corresponding to the selected memory cell column.

The data read circuit 52b is different from the data read circuit 52a shown in FIG. 2 with respect to the point that the resistor 168 is not provided and the point that a transistor 164 is electrically coupled between a node Nr2 and the node Ns2. The configuration of the other portion of the data read circuit 52b is similar to that of the data read circuit 52a, so that its detailed description will not be repeated.

The data read circuit 52b performs a data reading operation by supplying the same sense current Is to the data buses DB and /DB and detecting and amplifying a voltage difference between the data buses DB and /DB.

With such a configuration, in addition to the effect produced by the configuration according to the first embodiment, a data reading operation can be executed on the basis of the folded type bit line configuration, so that a data read margin can be sufficiently assured and the data reading operation can be further stabilized.

Since the sum of the electric resistance value of the bit line BL and the electric resistance value of the reference voltage line SL included in a sense current (Isc in the diagram) supplied to the memory cell MC and that included in a sense current (Isd in the diagram) supplied to the dummy memory cell DMC are similar to each other, by setting the sense currents to the same level, a margin in a complementary data reading operation can be improved.

Since FIG. 7 shows the configuration in which the dummy memory cells DMC are disposed at an end of the memory array 10, when the memory cell MC and the dummy memory cell DMC commonly use the reference voltage line SL, there is not a lot of harm. When there is harm in sharing the reference voltage line depending on the layout of the dummy memory cells DMC, the reference voltage line SL for the dummy memory cells DMC and that for the normal memory cells MC may be disposed independent of each other.

Second Embodiment

In a second embodiment, a configuration of preventing fluctuation in a resistance value in a sense current path on the data bus DB depending on the position of the selected memory cell column will be described.

Figure 8:
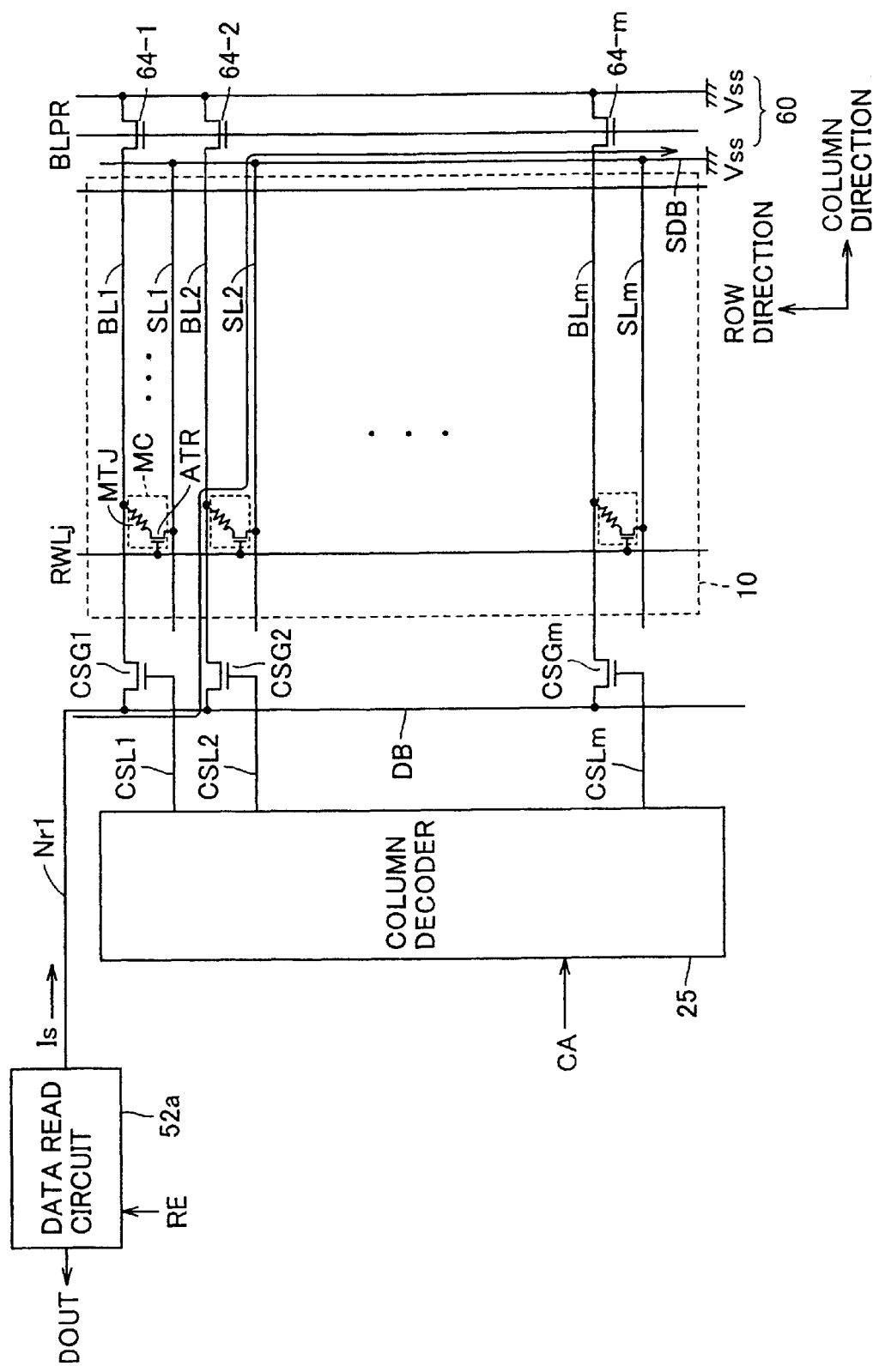
FIG. 8 is a diagram for explaining in detail the configuration related to a data reading operation of a memory array and its peripheral circuits in accordance with a second embodiment.

Referring to FIG. 8, the configuration according to the second embodiment is different from that of the first embodiment shown in FIG. 2 with respect to the point that a pseudo data bus SDB is provided. The pseudo data bus SDB is disposed so that its electric resistance value per unit length is similar to that of the data bus DB in a manner similar to the relation between the reference voltage line SL and the bit line BL in the first embodiment. The pseudo data bus SDB is disposed in the row direction in an area opposite to the data bus DB over the memory array 10.

The pseudo data bus SDB is coupled to the ground voltage Vss as a read reference voltage.

The area in which the data read circuit 52a and the data bus DB are connected to each other and the area in which the pseudo data bus SDB and the ground voltage Vss are coupled to each other are positioned on the sides opposite to each other in the row direction over the memory array 10.

Further, the pseudo data bus SDB is electrically coupled to each of the reference voltage lines SL1 to SLm. That is, each reference voltage line SL is coupled to the ground voltage Vss via the pseudo data bus SDB.

The pseudo data bus SDB is disposed so as to be shared by the memory cell columns. In order to increase the accuracy of the data reading operation, it is therefore necessary to set the precharge voltage of each bit line BL to the same voltage as the read reference voltage, that is, the ground voltage Vss so as not to pass the currents other than the data read current Is through the pseudo data bus SDB.

With such a configuration, even when the position of the selected memory cell column changes, the sum of the electric resistance value of the data bus DB and the electric resistance value of the pseudo data bus SDB included in the current path of the sense current Is can be maintained almost constant. Consequently, fluctuation in a current value of the sense current Is depending on the selected memory cell column can be further prevented. As a result, the operation margin in the data reading operation can be maintained more uniformly in the memory array, and the operation margin of the whole MRAM device can be sufficiently assured.

First Modification of Second Embodiment

Figure 9:
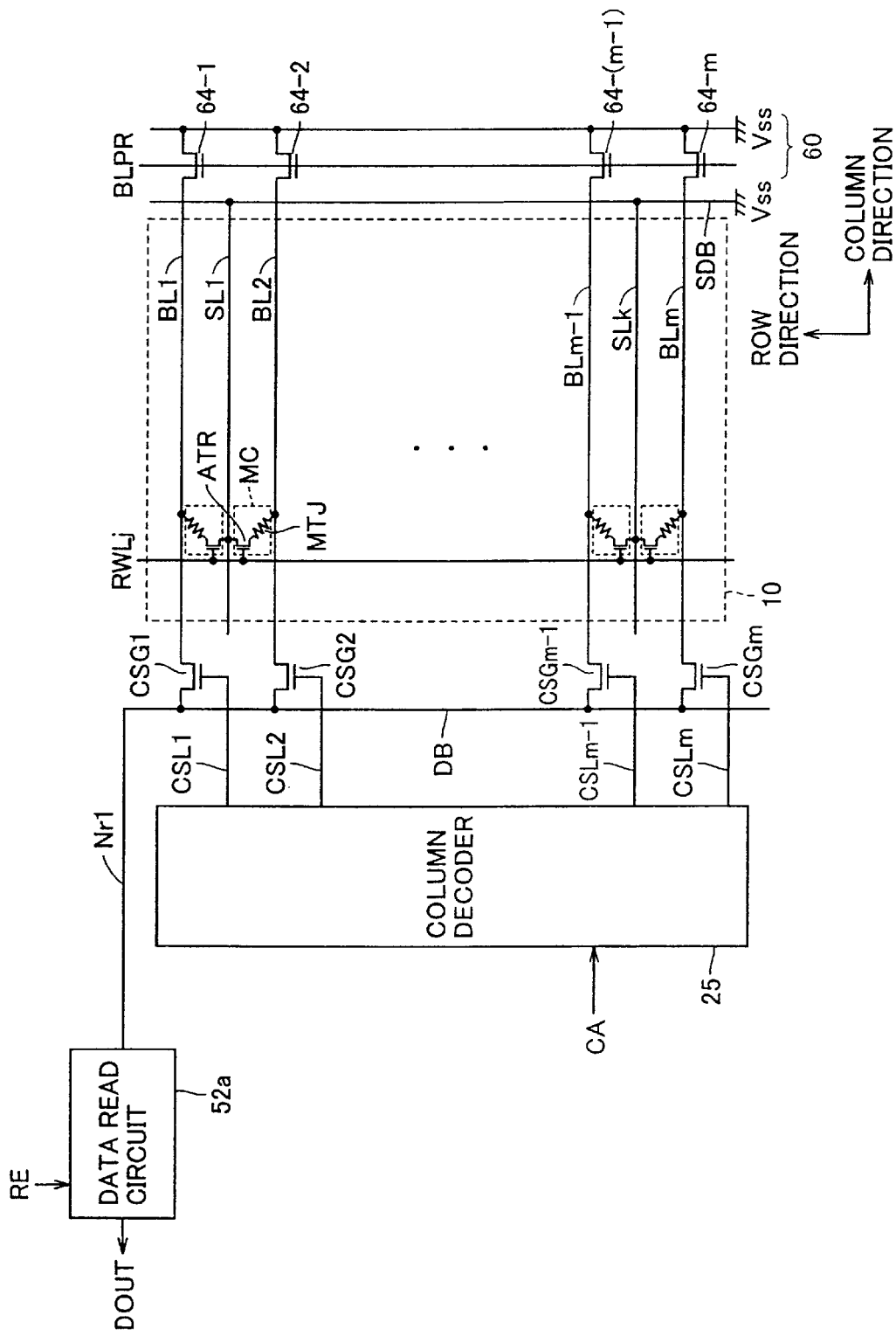
FIG. 9 is a diagram for explaining in detail the configuration related to a data reading operation of a memory array and its peripheral circuits in accordance with a first modification of the second embodiment.

Referring to FIG. 9, in the configuration according to a first modification of the second embodiment, in addition to the configuration according to the first modification of the first embodiment shown in FIG. 6, a pseudo data bus SDB similar to that shown in FIG. 8 is also disposed. Each of the reference voltage lines SL1 to SLk shared by neighboring memory cells is coupled to the ground voltage Vss via the pseudo data bus SDB. Since the configuration of the other portion is similar to that of FIG. 6, its detailed description will not be repeated.

With such a configuration, fluctuation in the current value of the sense current Is depending on the selected memory cell column can be further prevented. As a result, in addition to the effect of the first modification of the first embodiment, an operation margin in the data reading operation in the memory array can be maintained more uniformly.

Second Modification of Second Embodiment

Figure 10:
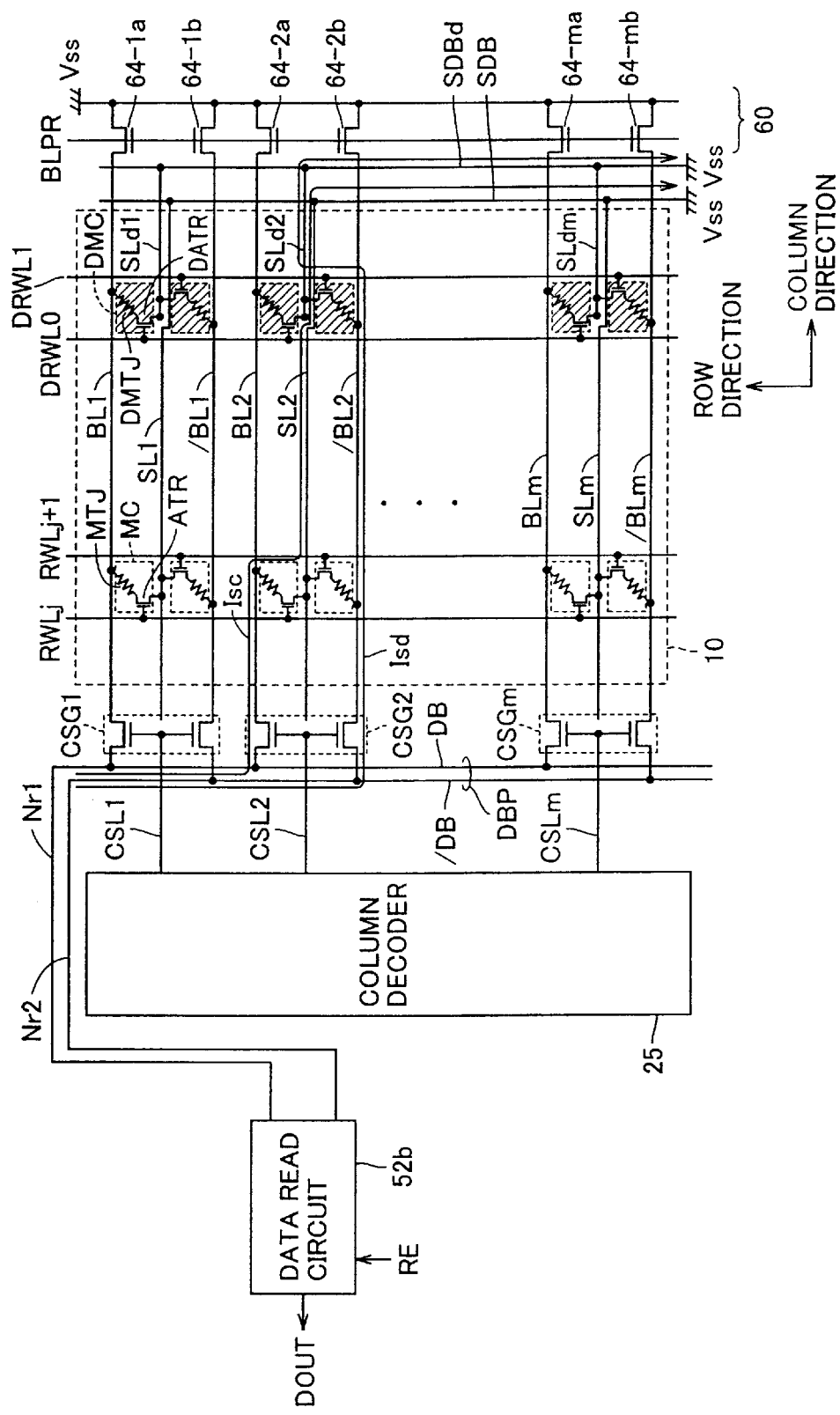
FIG. 10 is a diagram for explaining in detail the configuration related to a data reading operation of a memory array and its peripheral circuits in accordance with a second modification of the second embodiment.

Referring to FIG. 10, in the configuration according to a second modification of the second embodiment, in addition to the configuration according to the second modification of the first embodiment shown in FIG. 7, the pseudo data bus SDB and a pseudo dummy data bus SDBd are disposed. The pseudo data bus DB and the pseudo dummy data bus SDBd are disposed in the row direction in an area opposite to the data bus DB over the memory array 10.

The pseudo data bus SDB and the pseudo dummy data bus SDBd and the data buses DB and /DB are disposed so that their electric resistance values per unit length are similar to each other in a manner similar to the relation between the reference voltage line SL and the bit line BL in the first embodiment.

Each of the pseudo data bus SDB and the pseudo dummy data bus SDBd is coupled to the ground voltage Vss as a read reference voltage. The area in which the data read circuit 52b and the data buses DB and /DB are connected to each other and the area in which the pseudo data bus SDB and the pseudo dummy data bus SDBd are coupled to the ground voltage Vss are positioned on the sides opposite to each other over the memory array 10 in the row direction.

The reference voltage lines SL1 to SLm for supplying the ground voltage Vss to the memory cells MC and the dummy reference voltage lines SLd1 to SLdm for supplying the ground voltage Vss to the dummy memory cells DMC are disposed independent of each other. In the case of generically calling the dummy reference voltage lines SLd1 to SLdm, simply, reference characters SLd will be used.

The pseudo data bus SDB is coupled to each of the reference voltage lines SL1 to SLm, and the pseudo dummy data bus SDBd is coupled to each of the dummy reference voltage lines SLd1 to SLdm.

Each of the reference voltage line SL and the dummy reference voltage line SLd is formed so that its electric resistance value per unit length is similar to that of each bit line BL in a manner similar to the relation between the reference voltage line SL and the bit line BL in the first embodiment. Since the configuration of the other portion is similar to that of FIG. 7, the detailed description will not be repeated.

With such a configuration, in the memory array 10, without depending on both the row and column to which the memory cell MC is to be selected belongs, the sum of the electric resistance values of signal lines included in the current path of the sense current Is is maintained to an almost constant value, thereby enabling fluctuation in the sense current Is to be prevented.

Since the sense current (Isc in the diagram) supplied to the memory cell MC and the sense current (Isd in the diagram) supplied to the dummy memory cell DMC can be set to the same level without depending on both the row and column to which the memory cell MC to be selected belongs, a margin in a complementary data reading operation can be improved.

As a result, in addition to the effect produced by the second modification of the first embodiment, an operation margin in the data reading operation can be more uniformly maintained in the memory array.

Third Embodiment

Figure 11:
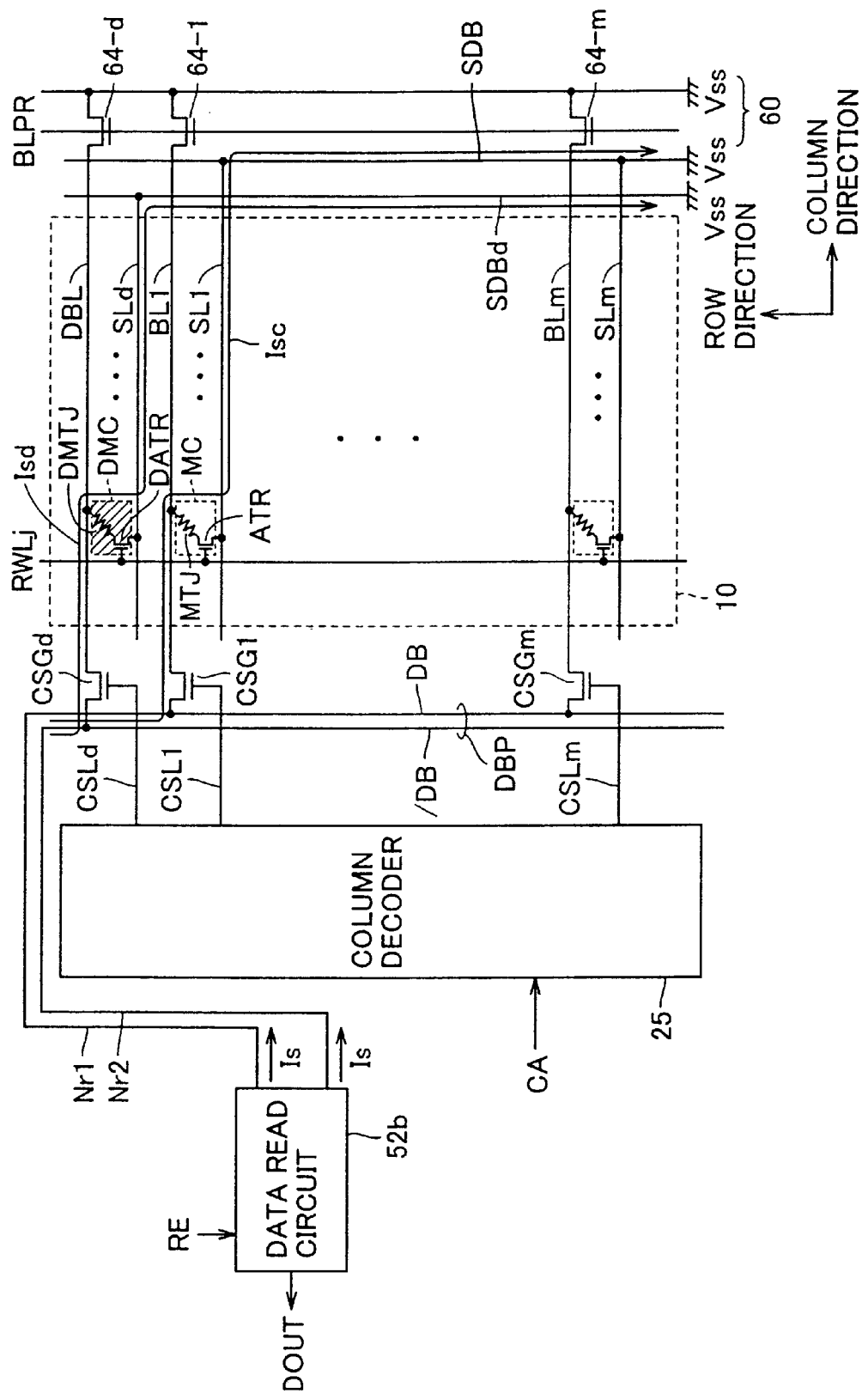
FIG. 11 is a diagram for explaining in detail the configuration related to a data reading operation of a memory array and its peripheral circuits in accordance with a third embodiment.

Referring to FIG. 11, in the configuration according to a third embodiment, dummy memory cells DMC are arranged so as to construct a dummy column. In correspondence with the dummy column, in the memory array 10, a dummy bit line DBL and a dummy reference voltage line SLd are provided.

The reference voltage line SL, dummy reference voltage line SLd, bit line BL, and dummy bit line DBL are formed so that their electric resistance values per unit length are similar to each other in a manner similar to the relation between the reference voltage line SL and the bit line BL in the first embodiment. Since the configuration of the other portion is similar to that of FIG. 7, its detailed description will not be repeated.

The column selection gate CSGd is disposed between the data bus /DB in the data bus pair DBP and the dummy bit line DBL. The column selection gate CSGd is turned on in response to activation of the column selection line CSLd. In the data reading operation, irrespective of the memory cell column to be selected, the column selection line CSLd is activated.

With such a configuration, also in the case where the dummy memory cells DMC are arranged so as to form a dummy column, in a manner similar to the second modification of the second embodiment, the data reading operation can be stabilized.

It is also possible to realize higher integration degree of the memory array 10 by sharing the reference voltage line SL corresponding to the memory cell MC in the memory array 10 by neighboring memory cell rows in a manner similar to the first modification of the second embodiment.

Fourth Embodiment

In a fourth embodiment, a data reading operation in a hierarchical data line configuration will be described.

Figure 12:
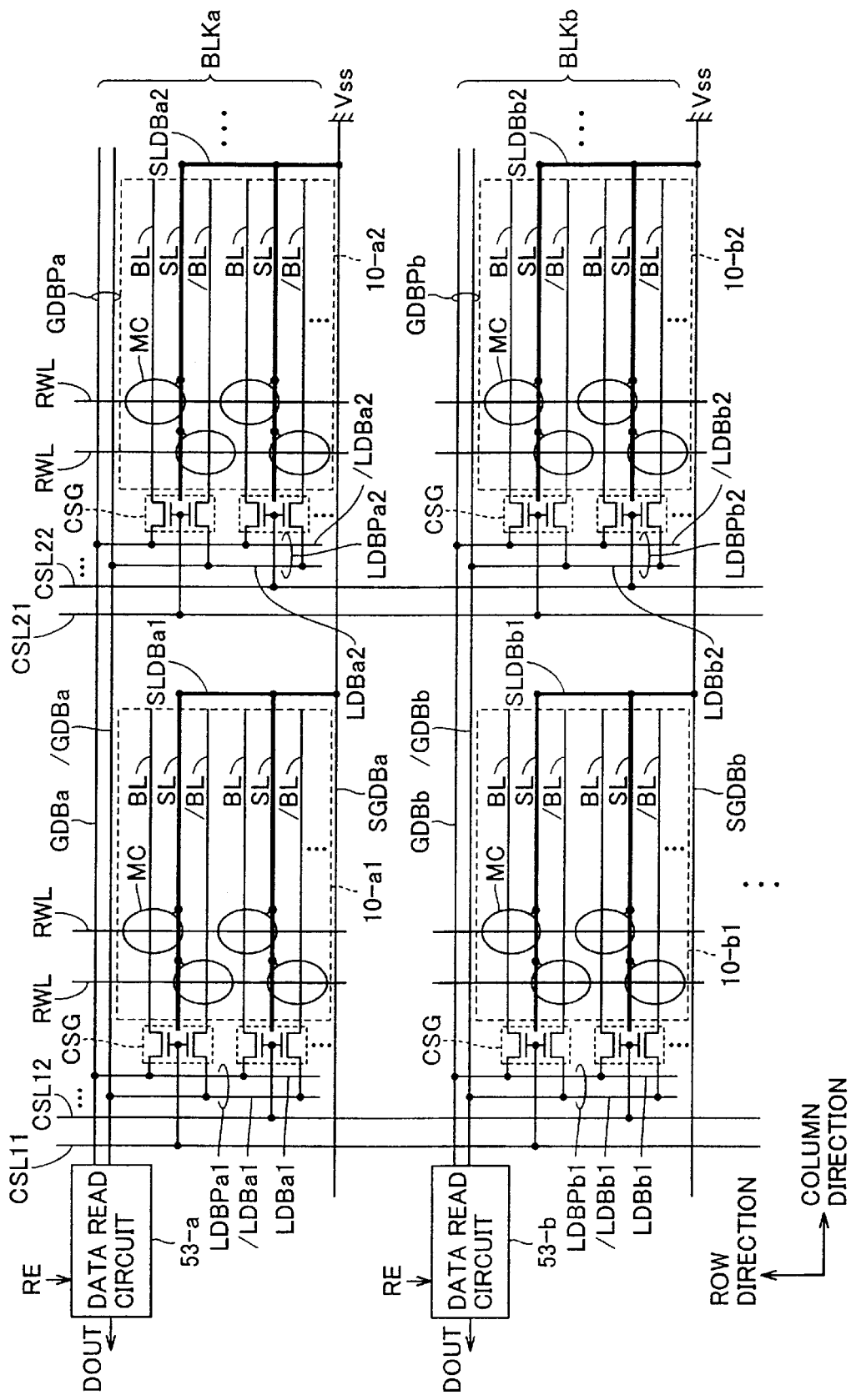
FIG. 12 is a diagram showing the configuration related to a data reading operation of an MRAM device according to a fourth embodiment of the invention.

FIG. 12 is a diagram showing the configuration related to a data reading operation of an MRAM device according to the fourth embodiment of the invention.

Referring to FIG. 12, in the MRAM device according to the fourth embodiment, a plurality of memory arrays are disposed in a matrix. The memory arrays are divided into a plurality of blocks BLKa, BLKb, . . . in the column direction.

FIG. 12 representatively shows memory arrays 10-$a$1, 10-$a$2, 10-$b$1 and 10-$b$2. The memory arrays 10-$a$1 and 10-$a$2 neighboring in the column direction belong to the same block BLKa. Similarly, the memory arrays 10-$b$1 and 10-$b$2 belong to the same block BLKb.

For each block, a data read circuit, a global data bus pair, and a pseudo global data bus are disposed. In FIG. 12, a data read circuit 53-$a$, a global data bus pair GDBPa, and a pseudo global data bus SGDBa corresponding to the block BLKa, and a data read circuit 53-$b$, a global data bus pair GDBPb, and a pseudo global data bus SGDBb corresponding to the block BLKb are representatively shown.

The global data bus pair GDBPa is constructed by global buses GDBa and /GDBa. Similarly, the global data bus pair GDBPb is constructed by global data buses GDBb and /GDBb.

In a data reading operation, a memory cell is selected independently in each block. Each of the data read circuits 53-$a$ and 53-$b$ executes a data reading operation by supplying the sense current Is to each of the global data buses constructing the corresponding global data bus pair. Since the configuration and operation of each of the data read circuits 53-$a$ and 53-$b$ are similar to those of the data read circuit 52$b$ shown in FIG. 7, the detailed description will not be repeated.

In the following, the global data bus pair, global data bus, and pseudo global data bus will be generically described by reference characters GDBP, GDB (/GDB), and SGDB, respectively. In the case of referring to specific global data bus pair, global data bus, and pseudo global data bus, a subscript is added to the reference characters like GDBPa, GDBa (/GDBa), and SGDBa.

The global data buses GDB and /GDB and the pseudo global data bus SGDB are arranged along the column direction. The global data buses GDB and /GDB and the pseudo global data bus SGDB are arranged so that their electric resistance values per unit length are similar to each other.

The area in which the data read circuit 53 and the global data bus pair GDBP are connected to each other and the area in which each pseudo global data bus SGDB is coupled to the ground voltage Vss as a read reference voltage are positioned on the sides opposite to each other over a group of memory arrays arranged in a matrix.

With such a configuration, in each block, without depending on the position of the memory array to which a selected memory cell belongs, by setting the sum of the electric resistance value of the global data bus GDB (/GDB) and the electric resistance value of the pseudo global data bus SGDB included in the path of the data read current almost constant, the sense current Is can be maintained to be constant.

Each of the memory arrays 10-$a$1, 10-$a$2, . . . has the configuration similar to that of the memory array 10 shown in FIG. 10. Therefore, the plurality of memory cells MC, bit lines BL, reference voltage lines SL, and column selection gates CSG disposed in and around the memory array will be described by using generic reference characters without distinguishing them from each other.

For each of the memory arrays, a local data bus pair LDBP coupled to the corresponding global data bus pair GDBP is provided. Each local data bus pair LDBP corresponds to the data bus pair DBP shown in FIG. 10 and has local data buses LDB and /LDB.

FIG. 12 representatively shows local data bus pairs LDBPa1, LDBPa2, LDBPb1, and LDBPb2 disposed in correspondence with the memory arrays 10-a1, 10-a2, 10-b1, and 10-b2, respectively.

The local data bus pair LDBPa1 is constructed by the local data buses LDBa1 and /LDBa1. The local data bus pair LDBPa2 is constructed by local data buses LDBa2 and /LDBa2. The local data bus pair LDBPb1 is constructed by local data buses LDBb1 and LDBb1. The local data bus pair LDBPb2 is constructed by local data buses LDBb2 and /LDBb2.

In the following, in the case of generically calling the local data bus pair and the local data bus, they will be simply referred to by reference characters LDBP and LDB (/LDB).

For each memory array, the column selection gates CSG similar to those in FIG. 7 are disposed in correspondence with the memory cell columns. The column selection gates CSG are selectively turned on in accordance with activation of the corresponding column selection line CSL. The column selection line CSL can be shared by memory arrays which are neighboring in the row direction.

The bit lines BL and /BL in the memory array are electrically coupled to the local data buses DBP and /DBP, respectively, constructing the local data bus pair LDBP.

By constructing the data buses hierarchically as described above, the load capacitance of the global data bus pair GDBP and the local data bus pair LDBP is reduced, so that the data reading operation can be performed at higher speed.

Further, for each memory array, a pseudo local data bus SLDB corresponding to the pseudo data bus SDB shown in FIG. 7 is disposed. FIG. 12 representatively shows pseudo local data buses SLDBa1, SLDBa2, SLDBb1, and SLDBb2 corresponding to the memory arrays 10-a1, 10-a2, 10-b1, and 10-b2, respectively.

Each pseudo local data bus SLDB is designed so that its electric resistance value per unit length is similar to that of each of the local data buses LDB and /LDB constructing the local data bus pair LDBP.

Although not shown for simplicity of the drawing, in each memory array, lines corresponding to the dummy memory cell DMC, dummy reference voltage line SLd, and pseudo dummy data bus SDBd shown in FIG. 10 are arranged.

In a manner similar to the second modification of the second embodiment, in each memory array, without depending on the position of the memory cell to be selected, the sense current Is can be therefore maintained to be constant. As a result, in the MRAM device according to the fourth embodiment, by constructing the data buses hierarchically, the data reading operation can be performed at higher speed, a data read margin is uniformly assured without depending on the positions of the memory array and memory cell to be selected, and a stable data reading operation can be executed.

Each of the memory arrays arranged in a matrix can use any of the configurations of the memory arrays 10 according to the first to third embodiments and their modifications. As necessary, it is sufficient to dispose a single global data bus and a single local data bus, not as a data bus pair and use a configuration similar to that of the data read circuit 52a shown in FIG. 2 as that of the data read circuit 53.

The first to fourth embodiments and their modifications show only the case where the read reference voltage supplied via the reference voltage line SL is the ground voltage Vss. The read reference voltage may be other voltage, for example, a power supply voltage Vcc. In this case, it is sufficient to invert the polarity of the voltage shown in each of the drawings, for example, by pulling down the voltage of the data bus DB to the ground voltage Vss in the data read circuit 52a, 52b, and 53.

Fifth Embodiment

In a fifth embodiment, stabilization in a data reading operation in the case where a memory cell having a configuration of using a diode as an access device is applied, suitable for higher integration degree will be described.

Figure 13:
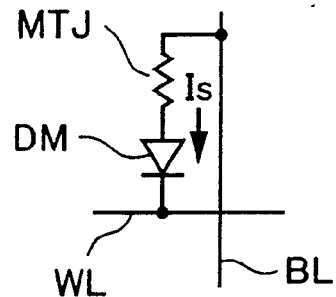
FIG. 13 is a schematic diagram showing a first configuration example of an MTJ memory cell using a diode.

Referring to FIG. 13, an MTJ memory cell MCDD using a diode has a magnetic tunnel junction MTJ and an access diode DM. The access diode DM is coupled between the magnetic tunnel junction MTJ and the word line WL by using the direction from the magnetic tunnel junction MTJ to the word line WL as a forward direction. The bit line BL is provided in a direction crossing the word line WL and is coupled to the magnetic tunnel junction MTJ.

Data is written to the MTJ memory cell MCDD by passing a data write current to the word line WL and the bit line BL. The direction of the data write current is set according to the level of the write data in a manner similar to the case of the memory cell using the access transistor.

On the other hand, in the data reading operation, the word line WL corresponding to the selected memory cell is set to a low voltage (for example, the ground voltage Vss) state. By precharging the bit line BL to a high voltage (for example, the power supply voltage Vcc) state, the access diode DM is forward biased and is made conductive, and the sense current Is can be passed to the magnetic tunnel junction MTJ.

Since the word line WL corresponding to a non-selected memory cell is set to a high voltage state, the corresponding access diode DM is reverse biased and maintains a non-selected state, so that no sense current Is is passed.

In such a manner, in the MTJ memory cell using the access diode as well, the data reading and writing operations can be executed.

Figure 14:
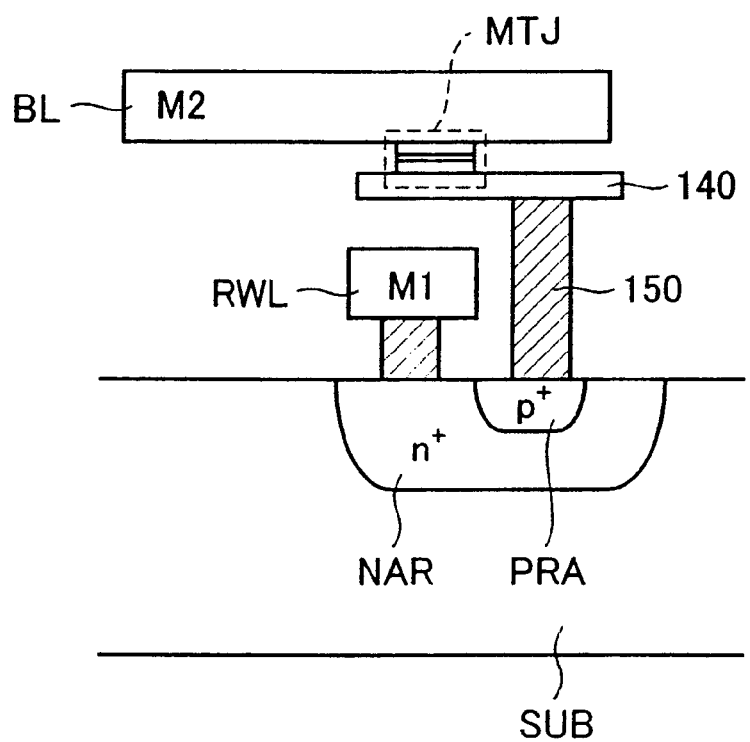
FIG. 14 is a diagram showing the structure in which the MTJ memory cell illustrated in FIG. 13 is disposed on a semiconductor substrate.

Referring to FIG. 14, the access diode DM is formed by an n-type area NAR in a semiconductor main substrate SUB and a p-type area PAR provided in the n-type area NAR.

The n-type area NAR corresponding to the cathode of the access diode DM is coupled to the word line WL formed in the metal wiring layer M1. The p-type area PAR corresponding to the anode of the access diode DM is electrically coupled to the magnetic tunnel junction MTJ via the barrier metal 140 and the metal film 150. The bit line BL is disposed in the metal wiring layer M2 and is electrically coupled to the magnetic tunnel junction MTJ. By using the access diode in place of the access transistor, the MTJ memory cell advantageous for higher integration degree can be constructed.

In the data writing operation, however, the data write current is passed to the word line WL and the bit line BL. Consequently, a voltage drop caused by the data write current occurs in the lines. As a result of such a voltage drop, depending on the voltage distribution on the word line WL and the bit line BL, there is a fear that the PN junction of the access diode DM is turned on in a part of the MTJ memory cells which are not targets of the data writing. As a result, an erroneous data writing operation may be executed due to passage of an unexpected current to the MTJ memory cell.

Another configuration example of the MTJ memory cell using the diode will now be described.

Figure 15:
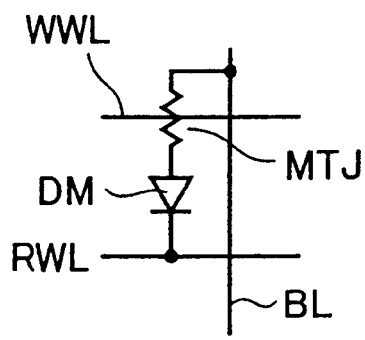
FIG. 15 is a schematic diagram showing a second configuration example of the MTJ memory cell using a diode.

Referring to FIG. 15, the MTJ memory cell MCD using the diode has, like the configuration shown in FIG. 13, the magnetic tunnel junction MTJ and the access diode DM. The MTJ memory cell MCD is different from the MTJ memory cell MCDD shown in FIG. 13 with respect to the point that the read word line RWL and the write word line WWL are separately disposed. The bit line BL is disposed in a direction crossing the write word line WWL and read word line RWL and is electrically coupled to the magnetic tunnel junction MTJ.

The access diode DM is coupled between the magnetic tunnel junction MTJ and the read word line RWL by using the direction from the magnetic tunnel junction MTJ to the read word line RWL as a forward direction. The write word line WWL is provided close to the magnetic tunnel junction MTJ without being connected to other lines.

In the MTJ memory cell MCD, it is unnecessary to pass the current to the read word line RWL in the data writing operation. Consequently, the voltage of the read word line RWL is stably maintained at a high voltage state (power supply voltage Vcc), the access diode DM is reverse biased with reliability, and a non-conductive state can be maintained. As compared with the MTJ memory cell MCDD shown in FIG. 13, the data writing operation can be more stabilized.

Figure 16:
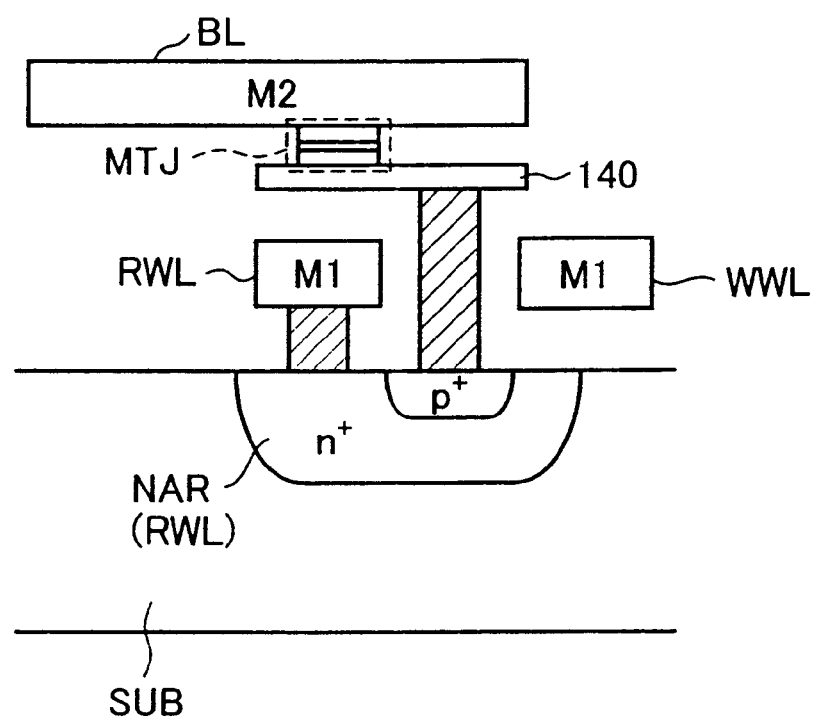
FIG. 16 is a diagram showing the structure in which the MTJ memory cell illustrated in FIG. 15 is disposed on a semiconductor substrate.

Referring to FIG. 16, the MTJ memory cell MCD is different from the MTJ memory cell MCDD illustrated in FIG. 14 with respect to the point that a write word line WWL disposed as an independent line is further provided. Since the structure of the other portion is similar to that of FIG. 14, the detailed description will not be repeated. The write word line WWL can be formed, for example, in the metal wiring layer M1 in which the read word line RWL is also formed.

By electrically coupling the n-type areas NAR each corresponding to the cathode of the access diode DM, of the MTJ memory cell MCDs belong to the same row, without particularly providing the read word line RWL, the coupling relation between the access diode DM and the read word line RWL shown in FIG. 15 can be realized. With such a configuration, both higher integration degree and stabilized operation can be realized.

The memory cells MCD and MCDD shown in FIGS. 13 and 15 have the same configuration related to the data reading operation. In the following, stabilization of the data reading operation in the memory array 10 in which the memory cells MCD are arranged representatively will be described. In the following description, that is, the memory cell MCD can be replaced by the memory cell MCDD.

In the following, also in the memory cells MCD and MCDD each using the diode, in a manner similar to the memory cell MC using the access transistor, a part corresponding to the magnetic tunnel junction MTJ in each memory cell can be replaced by a device whose electric resistance value changes according to the level of storage data.

Figure 17:
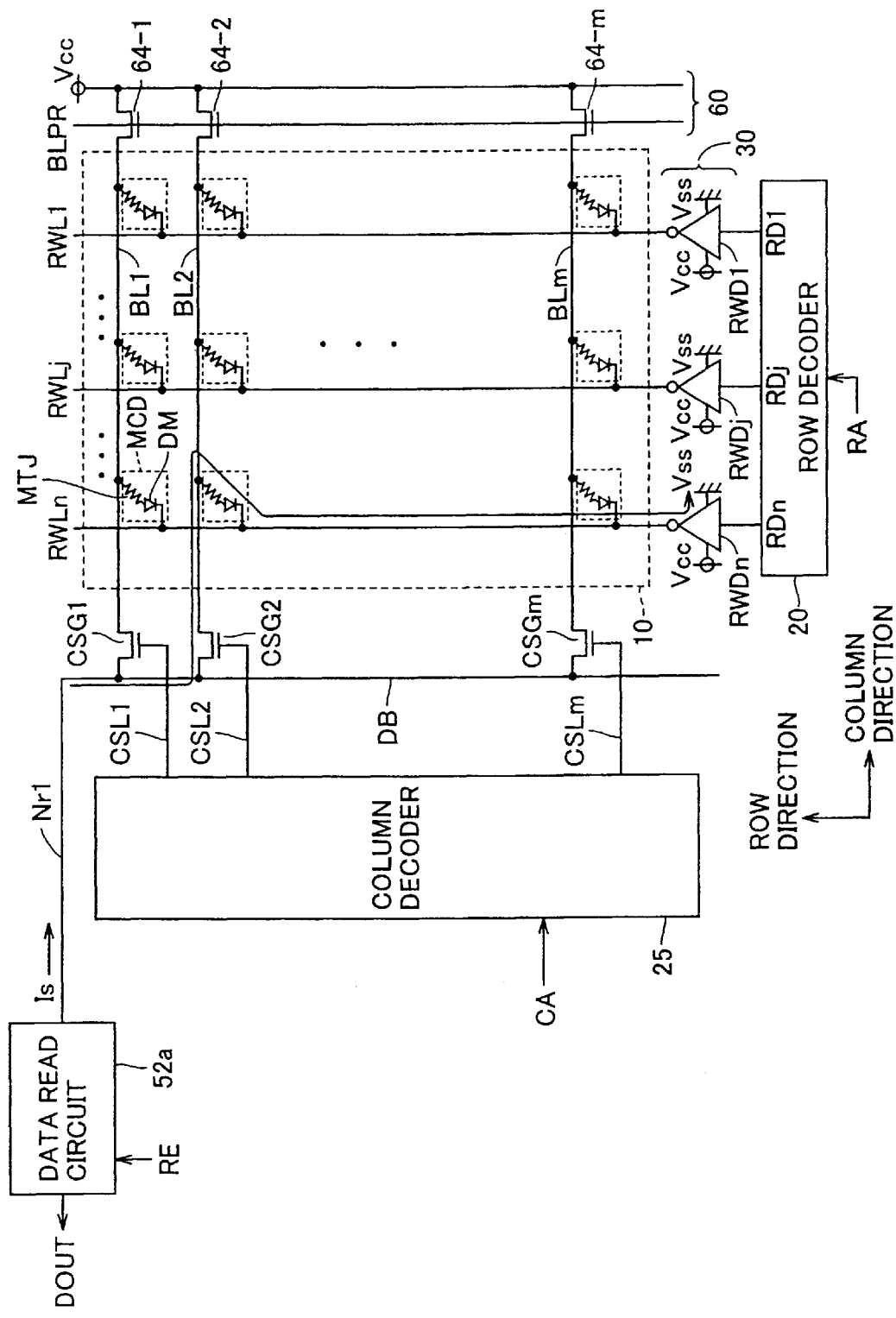
FIG. 17 is a diagram for explaining in detail of the configuration related to a data reading operation of a memory array and its peripheral circuits in accordance with a fifth embodiment of the invention.

Referring to FIG. 17, in the memory array 10, the memory cells MCD each having the configuration shown in FIG. 15 are arranged in a matrix of n rows and m columns. In FIG. 17, the write word line WWL which is not related to the data reading operation is not illustrated.

The word line driver 30 has word drivers RWD1 to RWDn provided in correspondence with the read word lines RWL1 to RWLn, respectively. In the following, in the case of generically calling the word drivers RWD1 to RWDn, they will be also described simply as a word driver RWD.

The word drivers RWD1 to RWDn set the voltage levels of the read word lines RWL1 to RWLn in response to row decode signals RD1 to RDn from the row decoder 20, respectively.

Each word driver RWD is constructed by, for example, an inverter and electrically couples the corresponding read word line RWL to the ground voltage Vss as a read reference voltage in response to the activation of the corresponding row decode signal. In response to this, the access diode DM is forward biased in the memory cell MCD and made conductive to pass the sense current Is to the magnetic tunnel junction MTJ electrically coupled between the bit line BL and the read word line RWL set to the ground voltage Vss. In such a manner, the data reading operation can be performed.

The sense current Is is supplied to the bit line BL in accordance with a result of column selection by the data read circuit 52a, data bus DB, column selection gate CSG, and column selection line CSL arranged in a manner similar to FIG. 2.

In the configuration according to the fifth embodiment, the read word line RWL and the data bus DB are arranged so that their electric resistance values per unit length are similar to each other like the relation between the reference voltage line SL and the bit line BL in the first embodiment. Further, on the side opposite (in the row direction) to an area in which the word drivers RWD1 to RWDn are disposed over the memory array 10, the data bus DB and the data read circuit 52a are coupled to each other.

With such a configuration, irrespective of the position of the selected memory cell column, the sum of the electric resistance values of the data bus DB and the read word line RWL included in the current path of the sense current Is can be maintained almost constant, so that fluctuation in the sense current Is can be prevented.

Also in the memory array suited for higher integration degree in which the memory cells each using the diode are arranged in a matrix, without depending on the selected memory cell column, a data read margin can be maintained to be uniform, and the data reading operation can be stabilized.

First Modification of Fifth Embodiment

Figure 18:
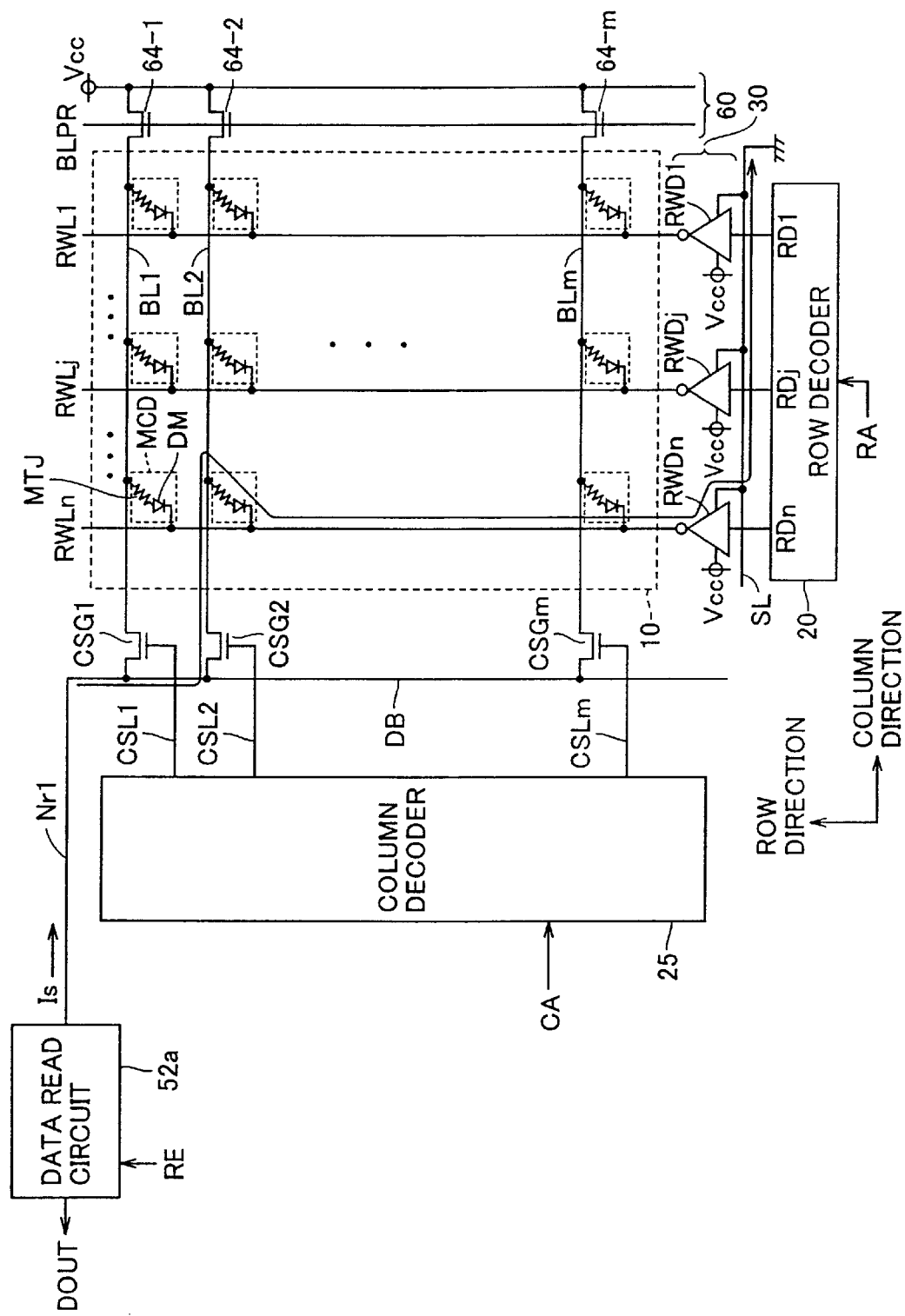
FIG. 18 is a diagram for explaining in detail of the configuration related to a data reading operation of a memory array and its peripheral circuits in accordance with a first modification of the fifth embodiment of the invention.

Referring to FIG. 18, in the configuration according to a first modification of the fifth embodiment, in addition to the configuration according to the fifth embodiment shown in FIG. 17, the reference voltage line SL for supplying the ground voltage Vss as a read reference voltage is further provided. The reference voltage line SL is disposed so that its electric resistance value per unit length is similar to that of the bit line BL in a manner similar to the relation between the reference voltage line SL and the bit line BL in the first embodiment.

The reference voltage line SL is disposed in the column direction and is coupled to the ground voltage Vss on the side opposite (in the column direction) over the memory array 10 to the area in which the bit line BL is coupled to the data bus DB, that is, the area in which the column selection gates CSG are disposed.

In the case of activating a corresponding read word line RWL, each word driver RWD electrically couples the read word line RWL to the reference voltage line SL. Since the configuration of the other portion is similar to that of FIG. 17, its detailed description will not be repeated.

With such a configuration, also in the memory array 10 in which memory cells each using a diode are arranged in a matrix, irrespective of the position of the selected memory row, the sum of the electric resistance value of the bit line BL and the electric resistance value of the reference voltage line SL included in the current path of the sense current Is is maintained to be almost constant, so that fluctuation in the sense current Is can be prevented.

Further, in a manner similar to the fifth embodiment, by designing the electric resistance values of the data bus DB and the read word line RWL, irrespective of the position of the selected memory cell, the operation margin in the data reading operation in the memory array can be maintained uniformly, and the operation margin of the whole MRAM device can be sufficiently assured.

Second Modification of Fifth Embodiment

In a second modification of the fifth embodiment, in addition to the configuration of the first modification of the fifth embodiment, a folded type bit line configuration is applied.

Figure 19:
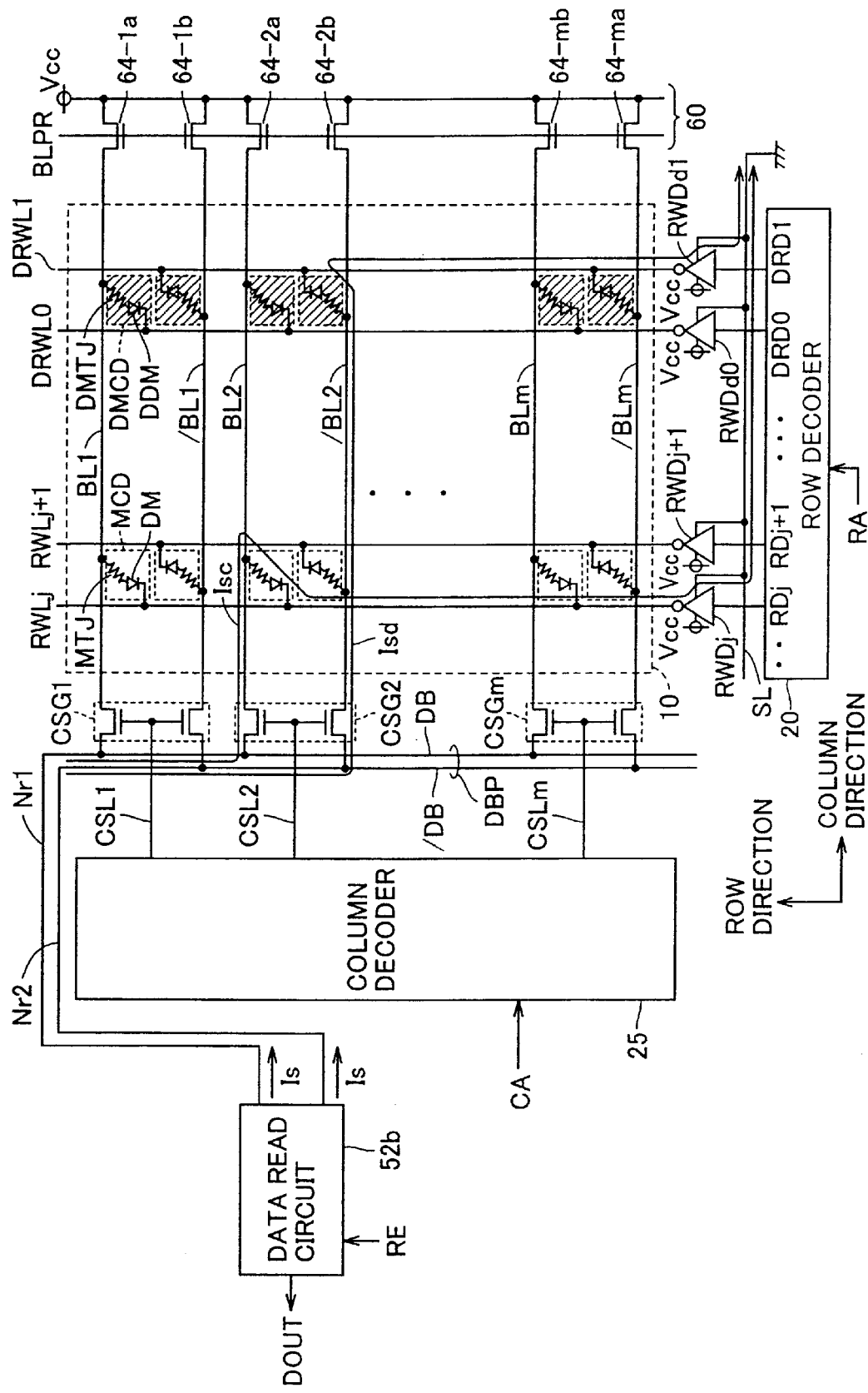
FIG. 19 is a diagram for explaining in detail of the configuration related to a data reading operation of a memory array and its peripheral circuits in accordance with a second modification of the fifth embodiment of the invention.

Referring to FIG. 19, in the memory array 10, the memory cell MCD and the dummy memory cell DMCD are arranged accompanying read word lines, dummy read word lines DRWL0 and DRWL1, respectively, in a manner similar to the memory cell MC and the dummy memory cell DMC shown in FIG. 7.

Each of the dummy memory cells DMCD has a dummy memory element DMTJ similar to that of the dummy memory cell DMC and an access diode DDM coupled to the dummy memory element DMTJ in series between one of the bit lines BL and /BL and the dummy read word line DRWL0 or DRWL1.

In FIG. 19, read word lines RWLj and RWLj+1 corresponding to j-th and (j+1)th memory cell rows and word drivers RWDj and RWDj+1 corresponding to the read word lines RWLj and RWLj+1 are representatively shown. Dummy word drivers RWDd0 and RWDd1 are arranged in correspondence with the dummy read word lines DRWL0 and DRWL1, respectively.

Like the configuration shown in FIG. 18, the word drivers are made active by being electrically coupled to the common reference voltage line SL, and the ground voltage Vss is supplied.

The bit line /BL complementary to the bit line BL in the bit line pair is disposed so that its resistance value per unit length is similar to that of each of the bit line BL and the reference voltage line SL. With such a configuration, also in the case of arranging the memory cells MCDD suitable for higher integration degree, a data read operation margin is assured on the basis of the folded type bit line configuration, and the data reading operation can be further stabilized.

The sense current (Isc in the drawing) supplied to the memory cell MC and the sense current (Isd in the drawing) supplied to the dummy memory cell DMC can be set to the same level without depending on both the row and column to which the memory cell MC to be selected belongs, so that a margin of the complementary data reading operation can be improved.

Although all combinations are not shown, in the first to fourth embodiments and their modifications, in place of the memory cell MC, the memory cell MCDD or MCD using an access diode can be also arranged.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A memory device comprising:
   a memory array having a plurality of memory cells arranged in a matrix;
   a plurality of read word lines provided in correspondence with rows of said memory cells and selectively activated in accordance with a row selection result in a data reading operation;
   a plurality of bit lines provided in correspondence with columns of said memory cells;
   a plurality of reference voltage lines for supplying a read reference voltage, disposed in correspondence with said columns in the same direction as said plurality of bit lines;
   a data bus disposed in the same direction as said plurality of read word lines in an area adjacent to said memory array;
   a data read circuit for supplying a data read current to be passed to a current path formed between the data read circuit and said read reference voltage to said data bus in said data reading operation;
   column selection portion for electrically coupling one, selected according to a column selection result, of said plurality of bit lines and said data bus; and
   a pseudo data bus disposed in the same direction as said data bus in an area opposite to said data bus over said memory array,
   said pseudo data bus electrically coupled to said read reference voltage and each of said reference voltage lines,
   each of said plurality of memory cells comprising:
      a memory element whose electric resistance value changes according to a level of storage data; and
      a memory selection gate electrically coupled in series with said memory element between corresponding one of said plurality of bit lines and corresponding one of said plurality of reference voltage lines and turned on in response to activation of corresponding one of said plurality of read word lines, and
      in said data reading operation, a sum of the electric resistance value of said data bus and the electric resistance value of said pseudo data bus in a portion included in said current path being almost constant independent of said column selection result.

2. The memory device according to claims 1,
   wherein one end side of said data bus is coupled to said data read circuit and receives supply of said data read current,
   said pseudo data bus is coupled to said read reference voltage on a side opposite to said one end side over said memory array, and
   an electric resistance value per unit length of said data bus and that of said pseudo data bus are similar to each other.

3. The memory device according to claim 1,
   wherein in said data reading operation, a sum of an electric resistance value of the reference voltage line corresponding to a selected column and an electric resistance value of the bit line corresponding to the selected column in a portion included in said current path is almost constant without depending on said row selection result.

4. The memory device according to claim 1,
   wherein said plurality of bit lines are precharged to said read reference voltage before said data reading operation, and
   neighboring memory cells share one of said plurality of reference voltage lines.

5. The memory device according to claim 1,
further comprising:
a plurality of complementary bit lines provided in correspondence with said plurality of bit lines, each having an electric resistance value per unit length similar to that of each of said bit lines; and
a complementary data bus provided in correspondence with said data bus, whose electric resistance value per unit length is similar to that of said data bus,
wherein said data read circuit supplies said data read current to each of said data bus and said complementary data bus in said data reading operation,
said memory array further includes a plurality of dummy memory cells disposed in correspondence with said columns,
said memory device further includes a plurality of dummy reference voltage lines for supplying said read reference voltage to said plurality of dummy memory cells, disposed in correspondence with said columns in the same direction as said plurality of reference voltage lines,
said column selection portion electrically couples said data bus and said complementary data bus to the bit line in correspondence with a selected column and the complementary bit line in correspondence with the selected column, respectively, in said data reading operation,
each of said dummy memory cells includes:
 a dummy memory element having an electric resistance value which is an intermediate value between first and second electric resistance values either one of which is set according to a level of said storage data of said memory element; and
 a dummy memory cell selection gate which is coupled to said dummy memory element in series between one of corresponding one of said bit lines and corresponding one of said complementary bit lines and corresponding one of said reference voltage lines and is turned on according to said row selection result,
said memory device further comprising a word line driving circuit for selectively turning on said memory cell selection gate and said dummy memory cell selection gate in accordance with said row selection result, wherein
 the memory cells corresponding the selected row are electrically coupled between one of said plurality of bit lines and said plurality of complementary bit lines and said plurality of reference voltage line,
 said dummy memory cells are electrically coupled between the other one of said plurality of bit lines and said plurality of complementary bit lines and said plurality of reference voltage lines, and
 in said data reading operation, each of a first line resistance as a sum of an electric resistance value of one of the bit line and the complementary bit line and an electric resistance value of the reference voltage line of a portion included in said current path corresponding to the selected column and a second line resistance of as a sum of an electric resistance value of the other one of the bit line and the complementary bit line and an electric resistance value of said dummy reference voltage line of a portion included in said current path is almost constant without depending on said row selection result.

6. The memory device according to claim 5,
further comprising:
 a pseudo dummy data bus disposed in the same direction as said pseudo data bus,
wherein one end side of said data bus is coupled to said data read circuit and receives supply of said data read current,
said pseudo data bus and said pseudo dummy data bus are coupled to said read reference voltage on the side opposite to said one end side over said memory array, and
said data bus, said pseudo data bus, and said pseudo dummy data bus have similar electric resistance values per unit length.

7. The memory device according to claim 5,
wherein said first line resistance and said second line resistance are similar values.

8. The memory device according to claim 1,
wherein said memory array further includes a plurality of dummy memory cells disposed so as to construct a dummy column,
said memory device further comprises:
 a complimentary data bus provided in correspondence with said data bus and having an electric resistance value per unit length similar to that of said data bus;
 a dummy bit line disposed in the same direction as said plurality of bit lines in correspondence with said dummy column, and having an electric resistance value per unit length similar to that of each of said bit lines; and
 a dummy reference voltage line disposed in the same direction as said plurality of reference voltage lines in correspondence with said dummy column, for supplying said read reference voltage to said plurality of dummy memory cells,
said column selection portion further electrically couples said complementary data bus and said dummy bit line in said data reading operation,
each of said dummy memory cell includes:
 a dummy memory element having an electric resistance value which is an intermediate value between first and second electric resistance values either one of which is set according to a level of said storage data in said memory element; and
 a dummy memory cell selection gate which is coupled to said dummy memory element in series between said dummy bit line and said dummy reference voltage line and is turned on according to said row selection result, and
 in said data reading operation, each of first line resistance as a sum of an electric resistance value of the reference voltage line and an electric resistance value of the bit line in a portion included in said current path, corresponding to the selected column, and a second line resistance as a sum of an electric resistance value of said dummy reference voltage line and an electric resistance value of said dummy bit line in a portion included in said current path is almost constant without depending on said row selection result.

9. The memory device according to claim 1,
wherein a plurality of said memory arrays are disposed in a matrix,
said plurality of memory arrays are divided into a plurality of blocks in the same direction as said plurality of bit lines, said plurality of read word lines, said plurality of bit lines, said plurality of reference voltage lines, said data bus, said pseudo data bus, and said column selection portion are disposed for each of said plurality of memory arrays, said memory device further includes a plurality of global data buses and a plurality of global pseudo data buses disposed in correspondence with said plurality of blocks in the same direction as said plurality of bit lines, said data read circuit is disposed in correspondence with each of said plurality of blocks, and supplies said data read current to corresponding one of said plurality of global data buses, each of said plurality of global pseudo data buses is electrically coupled to said read reference voltage and is electrically coupled to the pseudo data buses corresponding to the memory arrays belonging to the same block, and in said data reading operation, a sum of an electric resistance value of the global data bus and an electric resistance value of the global pseudo data bus, of a portion included in said current path is almost constant without depending on said memory array selected in said block.

* * * * *